United States Patent [19]

Chao

[11] Patent Number: 5,904,522

[45] Date of Patent: May 18, 1999

[54] METHOD OF FABRICATING A SEMICONDUCTOR MEMORY DEVICE HAVING A CAPACITOR

[75] Inventor: Fang-Ching Chao, Hsinchu, Taiwan

[73] Assignee: United Microelectronics Corp., Taiwan

[21] Appl. No.: 08/767,025

[22] Filed: Dec. 16, 1996

[30] Foreign Application Priority Data

Aug. 16, 1996 [TW] Taiwan ................................. 85110000

[51] Int. Cl.⁶ .............................................. H01L 21/8242
[52] U.S. Cl. ........................................................... 438/254
[58] Field of Search .................................. 438/238, 239,
438/253–256, 381, 396–399

[56] References Cited

U.S. PATENT DOCUMENTS

| | | | |
|---|---|---|---|
| 5,071,783 | 12/1991 | Taguchi et al. | 438/254 |
| 5,077,688 | 12/1991 | Kumanoya et al. | 365/149 |
| 5,089,869 | 2/1992 | Matsuo et al. | 257/303 |
| 5,102,820 | 4/1992 | Chiba | 438/398 |
| 5,126,810 | 6/1992 | Gotou | 257/306 |
| 5,142,639 | 8/1992 | Kohyama et al. | 257/306 |
| 5,155,657 | 10/1992 | Oehrlein et al. | 361/313 |
| 5,158,905 | 10/1992 | Ahn | 438/396 |
| 5,164,337 | 11/1992 | Ogawa et al. | 438/254 |
| 5,172,201 | 12/1992 | Suizu | 257/308 |
| 5,196,365 | 3/1993 | Gotou | 438/259 |
| 5,206,787 | 4/1993 | Fujioka | 257/307 |
| 5,266,512 | 11/1993 | Kirsch | 438/253 |
| 5,274,258 | 12/1993 | Ahn | 257/308 |
| 5,338,955 | 8/1994 | Tamura et al. | 257/306 |
| 5,354,704 | 10/1994 | Yang et al. | 365/149 |
| 5,371,701 | 12/1994 | Lee et al. | 365/149 |
| 5,389,568 | 2/1995 | Yun | 438/396 |

(List continued on next page.)

FOREIGN PATENT DOCUMENTS

| | | |
|---|---|---|
| 0 516 031 A1 | 12/1992 | European Pat. Off. . |
| 4-26156 | 1/1992 | Japan . |
| 5-21745 | 1/1993 | Japan . |
| 5-251657 | 9/1993 | Japan . |
| 6-151748 | 5/1994 | Japan . |
| 2 252 447 | 8/1992 | United Kingdom . |

OTHER PUBLICATIONS

Ema et al., "3–Dimensional Stacked Capacitor Cell for 16M and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical Papers, pp. 69–70.

"Mini–Trenches in Polysilicon For Dram Storage Capacitance Enhancement", IBM Technical Disclosure Bulletin, vol. 33, No. 9, Feb. 1991.

Primary Examiner—Joni Chang
Attorney, Agent, or Firm—Rabin & Champagne, P.C.

[57] ABSTRACT

A method of fabricating a semiconductor memory device including a substrate with a transfer transistor formed thereon. A first insulating layer is formed on the substrate, covering the transfer transistor. A first conductive layer is formed, penetrating at least the first insulating layer and electrically coupling to a source/drain region of the transfer transistor. A second insulating layer and a stack layer are formed, and a third insulating layer is formed on the sidewalls of the stack layer. A fourth insulating layer is formed and an opening is made to expose a portion of the first conductive layer. A second conductive layer is formed over the stack layer and second insulating layer and filling the opening. The second conductive layer is defined and the stack layer and the second insulating layer below the stack layer are removed. The first and the second conductive layers are defined to form a storage electrode of the charge storage capacitor. The second insulating layer is removed and a dielectric layer is formed over the exposed surfaces of the first and second conductive layers. A third conductive layer is formed over the surface of the dielectric layer, serving as an opposing electrode of the charge storage capacitor.

51 Claims, 14 Drawing Sheets

U.S. PATENT DOCUMENTS

| | | | |
|---|---|---|---|
| 5,399,518 | 3/1995 | Sim et al. | 438/396 |
| 5,438,011 | 8/1995 | Blalock et al. | 438/396 |
| 5,443,993 | 8/1995 | Park et al. | 438/396 |
| 5,453,633 | 9/1995 | Yun | 257/306 |
| 5,460,996 | 10/1995 | Ryou | 438/254 |
| 5,478,768 | 12/1995 | Iwasa | 438/253 |
| 5,478,770 | 12/1995 | Kim | 438/253 |
| 5,482,886 | 1/1996 | Park et al. | 438/397 |
| 5,508,222 | 4/1996 | Sakao | 438/396 |
| 5,521,419 | 5/1996 | Wakamiya et al. | 257/394 |
| 5,523,542 | 6/1996 | Chen et al. | 438/396 |
| 5,543,346 | 8/1996 | Keum et al. | 438/397 |
| 5,550,080 | 8/1996 | Kim | 438/397 |
| 5,561,309 | 10/1996 | Cho et al. | 257/306 |
| 5,561,310 | 10/1996 | Woo et al. | 257/306 |
| 5,572,053 | 11/1996 | Ema | 257/308 |
| 5,595,931 | 1/1997 | Kim | 438/387 |
| 5,837,594 | 11/1998 | Honma et al. | 438/396 |
| 5,856,220 | 1/1999 | Wang et al. | 438/254 |

METHOD OF FABRICATING A SEMICONDUCTOR MEMORY DEVICE HAVING A CAPACITOR

BACKGROUND OF THE INVENTION

1. Field of the Invention

The invention relates in general to semiconductor memory devices, and more particularly to a method of fabricating a structure of a dynamic random access memory (DRAM) cell having a transfer transistor and a tree-type charge storage capacitor.

2. Description of Related Art

FIG. 1 is a circuit diagram of a memory cell for a DRAM device. As shown in the drawing, a DRAM cell is substantially composed of a transfer transistor T and a charge storage capacitor C. A source of the transfer transistor T is connected to a corresponding bit line BL, and a drain thereof is connected to a storage electrode 6 of the charge storage capacitor C. A gate of the transfer transistor T is connected to a corresponding word line WL. An opposing electrode 8 of the capacitor is connected to a constant power source. A dielectric film 7 is provided between the storage electrode 6 and the opposing electrode 8.

In the DRAM manufacturing process, a substantially two-dimensional capacitor called a planar type capacitor is mainly used for a conventional DRAM having a storage capacity less than 1 Mb (megabytes). In the case of a DRAM having a memory cell using a planar type capacitor, electric charges are stored on the main surface of a semiconductor substrate, so that the main surface is required to have a large area. This type of a memory cell is therefore not suited to a DRAM having a high degree of integration. For a high integration DRAM such as a DRAM with more than 4 Mb of memory, a three-dimensional capacitor, called a stacked-type or a trench-type capacitor, has been introduced.

With the stacked-type or trench-type capacitor, it has been made possible to obtain a larger memory in a similar volume. However, to realize a semiconductor device of an even higher degree of integration, such as a very-large-scale integration (VLSI) circuit having a capacity of 64 Mb, a capacitor of such a simple three-dimensional structure as the conventional stacked-type or trench-type, turns out to be insufficient.

One solution for improving the capacitance of a capacitor is to use the so-called fin-type stacked capacitor, which is proposed by Ema et al., in "3-Dimensional Stacked Capacitor Cell for 16 M and 64 M DRAMs", International Electronic Devices Meeting, pp. 592–595, December 1988. The fin-type stacked capacitor includes electrodes and dielectric films which extend horizontally in a fin shape in a plurality of stacked layers to increase the surface areas of the electrodes. DRAMs having the fin-type stacked capacitor are also disclosed in U.S. Pat. Nos. 5,071,783; 5,126,810; and 5,206,787.

Another solution for improving the capacitance of a capacitor is to use the so-called cylindrical-type stacked capacitor, which is proposed by Wakamiya et al., in "Novel Stacked Capacitor Cell for 64-Mb DRAM," 1989 Symposium on VLSI Technology Digest of Technical Papers, pp. 69–70. The cylindrical-type stacked capacitor includes electrodes and dielectric films which extend vertically in a cylindrical shape to increase the surface areas of the electrodes. A DRAM having the cylindrical-type stacked capacitor is also disclosed in U.S. Pat. No. 5,077,688.

With the trend toward increased integration density, the size of the DRAM cell in a plane (the area it occupies in a plane) must be further reduced. Generally, a reduction in the size of the cell leads to a reduction in charge storage capacity (capacitance). Additionally, as the capacitance is reduced, the likelihood of soft errors arising from the incidence of alpha-rays is increased. Therefore, there is still a need in this art to design a new structure of a storage capacitor which can achieve the same capacitance, while occupying a smaller area in a plane, and a suitable method of fabricating the structure.

SUMMARY OF THE INVENTION

It is therefore an object of the invention to provide a method for fabricating a semiconductor memory device with a tree-type capacitor structure that provides an increased area for charge storage.

In accordance with one preferred embodiment of the invention, a method for fabricating a semiconductor memory device having a capacitor is provided. The semiconductor memory device includes a substrate, a transfer transistor formed on the substrate, and a charge storage capacitor electrically coupled to one of the source/drain regions of the transfer transistor. The method of fabrication includes forming a first insulating layer over the substrate, covering the transfer transistor, and forming a first conductive layer, which penetrates at least through the first insulating layer, and is electrically coupled to one of the source/drain regions of the transfer transistor. A second insulating layer is then formed, and a stack layer is formed above the second insulating layer. A third insulating layer is formed on the sidewalls of the stack layer, and a fourth insulating layer is formed on the surfaces of the second and third insulating layers. The third and fourth insulating layers and the insulating layer below the third insulating layer are removed until the surface of the first conductive layer is exposed, thus forming an opening. A second conductive layer is formed on the surfaces of the stack layer and the second insulating layer and filling up the opening. The portion of the second conductive layer above the stack layer is removed, followed by removal of the stack layers and the portion of the second insulating layer below the stack layers, until the surface of the first conductive layer is exposed. The first and second conductive layers are defined such that one end of the second conductive layer is connected to the top surface of the first conductive layer, the first conductive layer forms a trunk-like conductive layer, the second conductive layer forms a branch-like conductive layer, and the first and second conductive layers in combination form a storage electrode of the charge storage capacitor. The second insulating layer is removed. A dielectric layer is formed on the exposed surfaces of the first and second conductive layers. A third conductive layer is formed over the surface of the dielectric layer, resulting in the formation of an opposing electrode of the charge storage capacitor.

According to one aspect of the invention, the trunk-like conductive layer is electrically coupled to one of the source/drain regions of the transfer transistor and can have a T-shaped or a U-shaped cross section. The branch-like conductive layer generally has a hollow cylindrical shape with an L-shaped cross section.

According to another aspect of the invention, an etching protection layer is formed above the first insulating layer, and a fifth insulating layer is formed over the etching protection layer, prior to forming the first conductive layer, which penetrates through the fifth insulating layer and the etching protection layer. The fifth insulating layer is removed with the second insulating layer.

According to a further aspect of the invention, multiple insulating layers, stack layers, and conductive layers are formed, to define additional branch-like conductive layers. Thus, the first conductive layer forms a trunk-like conductive layer, while the other conductive layers form at least two layers of branch-like conductive layers, with each branch-like conductive layer oriented substantially parallel to each other and each having one end connected to the top surface of the first conductive layer. All residual insulating layers beyond the first insulating layer are removed and a dielectric layer is formed over the exposed surfaces of the trunk-like conductive layer and the branch-like conductive layers.

According to an additional aspect of the invention, the portion of the second conductive layer above the stack layer is removed by chemical-mechanical polishing, or by etching.

In accordance with a second preferred embodiment of the invention, a method for fabricating a semiconductor memory device having a capacitor is provided. The semiconductor memory device includes a substrate, a transfer transistor formed on the substrate, and a charge storage capacitor electrically coupled to one of the source/drain regions of the transfer transistor. A first insulating layer is formed over the substrate, covering the transfer transistor. A first conductive layer is formed which penetrates at least through the first insulating layer, and is electrically coupled to one of the source/drain regions of the transfer transistor. A second insulating layer and a stack layer are formed above the second insulating layer. A third insulating layer is formed on the sidewalls of the stack layer and a fourth insulating layer is formed on the surfaces of the second and third insulating layers. The third and fourth insulating layer and the insulating layer below the third insulating layer are removed, such that the surface of the first conductive layer is exposed, thus forming an opening. A second conductive layer is formed on the surface of the stack layer and the second insulating layer and filling the opening. The second conductive layer is defined by removing the portion above the stack layer. The stack layer is removed, and a fifth insulating layer is formed on the surfaces of the second conductive layer and the second insulating layer. The fifth insulating layer is etched until the surface of the first conductive layer is exposed, forming a second opening. A third conductive layer is formed on the surface of the fifth insulating layer and in the second opening. The third, second, and first conductive layers are defined such that respective ends of the third and second conductive layers are connected to the top surface of the first conductive layer. The first conductive layer forms a trunk-like conductive layer, the second conductive layer forms a first branch-like conductive layer, and the third conductive layer forms a second branch-like conductive layer. The first, second, and third conductive layers together form a storage electrode of the charge storage capacitor. The fifth and second insulating layers are removed. A dielectric layer is formed over the exposed surfaces of the first, second, and third conductive layers. A fourth conductive layer is formed over the surface of the dielectric layer, resulting in the formation of an opposing electrode of the charge storage capacitor.

According to yet another aspect of the invention, multiple insulating layers, stack layers, and conductive layers are formed, to define additional branch-like conductive layers. Thus, the first conductive layer forms a trunk-like conductive layer, while the other conductive layers form at least two branch-like conductive layers, with each branch-like conductive layer being oriented substantially parallel to each other and each having one end connected to the top surfaces of the first conductive layer. All residual insulating layer beyond the first insulating layer are removed and a dielectric layer is formed on the exposed surfaces of the trunk-like conductive layer and the branch-like conductive layers.

BRIEF DESCRIPTION OF THE DRAWINGS

Other objects, features, and advantages of the invention will become apparent from the following detailed description of the preferred but non-limiting embodiments. The description is made with reference to the accompanying drawings, in which.

DESCRIPTION OF THE PREFERRED EMBODIMENTS

First Preferred Embodiment

A description will be given of a first embodiment of a semiconductor memory device having a tree-type charge storage capacitor according to the invention, by referring to FIGS. 2A through 2H.

Figure 1:
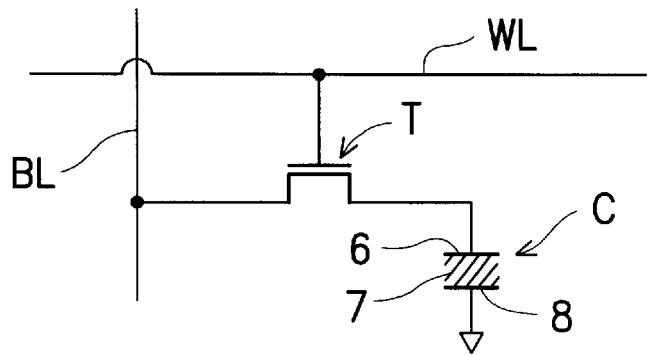
FIG. 1 is a circuit diagram of a memory cell of a DRAM device.
Figure 2A:
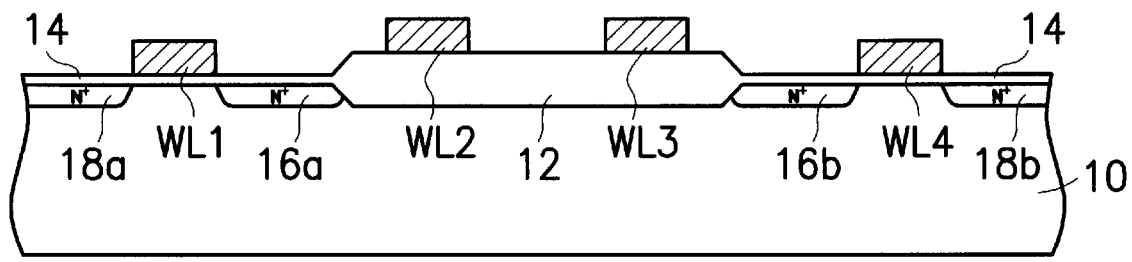
FIGS. 2A through 2H are cross-sectional views illustrating a first embodiment of a semiconductor memory device according to the invention, and a method for fabricating the same according to the invention.

Referring to FIG. 2A, a surface of a silicon substrate 10 is subjected to thermal oxidation by the LOCOS (local oxidation of silicon) technique, and thereby a field oxidation layer 12 having a thickness of approximately 3000 Å (Angstroms), for example, is formed. Next, a gate oxide layer 14 having a thickness of approximately 150 Å, for example, is formed by subjecting the silicon substrate 10 to the thermal oxidation process. Then a polysilicon layer having a thickness of approximately 2000 Å, for example, is deposited on the entire surface of the silicon substrate 10 by CVD (chemical vapor deposition) or LPCVD (low pressure CVD). In order to obtain a polysilicon layer of low resistance, suitable impurities such as phosphorus ions, for example, are implanted into the polysilicon layer. Preferably, a refractory metal layer is deposited over the polysilicon layer, and then an annealing process is carried out to form polycide, so that the layer's resistance is further decreased. The refractory metal may be tungsten (W), and its thickness is, for example, approximately 2000 Å. Thereafter, the polycide is subjected to a patterning process to form gate electrodes (or word lines) WL1 through WL4, as shown in FIG. 2A. Then, arsenic ions, for example, are implanted into the silicon substrate 10 at an energy of 70 KeV and a dosage of approximately $1 \times 10^{15}$ atoms/cm$^2$, for example. In this step, the word lines WL1 through WL4 are used as masking layers. As a result, drain regions 16a and 16b and source regions 18a and 18b are formed in the silicon substrate 10.

Figure 2B:
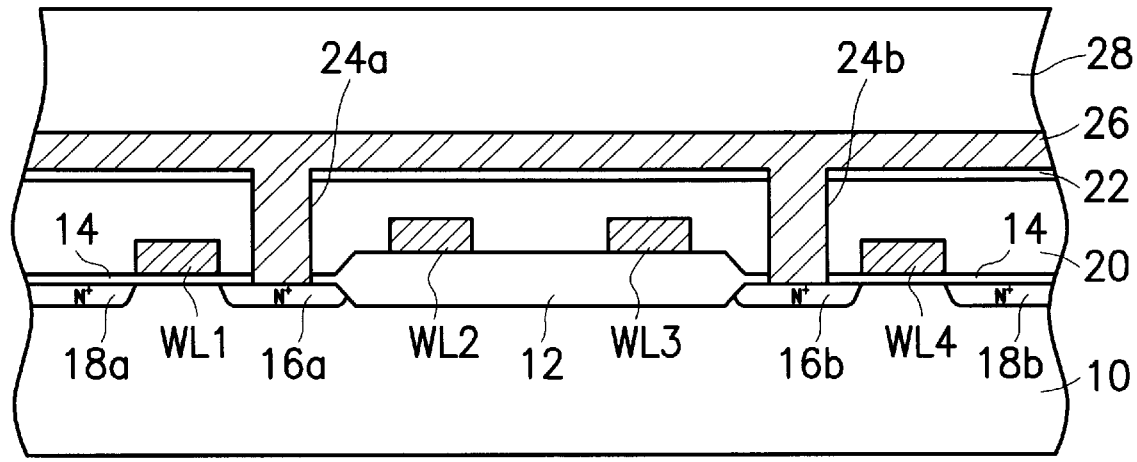

Referring next to FIG. 2B, in the subsequent step CVD is performed to deposit an insulating layer 20 of, for example, borophosphosilicate glass (BPSG), to a thickness of approximately 7000 Å, for example. Then the same method is used to form an etching protection layer 22, which can be, for example, a silicon nitride layer, having a thickness of approximately 1000 Å, for example. After that, a conventional photolithography and etching process is performed to etch selected parts of the etching protection layer 22, the insulating layer 20, and the gate oxide layer 14, so as to form storage electrode contact holes 24a, 24b which extend from the top surface of the etching protection layer 22 to the top surface of the drain regions 16a and 16b. Next, CVD is performed to deposit a polysilicon layer 26 over the surface of the etching protection layer 22. To increase the conductivity of the polysilicon layer 26, arsenic ions, for example, can be implanted into the polysilicon layer 26. As shown in the drawing, the storage electrode contact holes 24a, 24b are filled by the polysilicon layer 26, and the polysilicon layer 26 further covers the surface of the etching protection layer 22. Thereafter, a thick insulating layer 28 of, for example, silicon dioxide, is deposited over the surface of the polysilicon layer 26 to a thickness of approximately 7000 Å.

Figure 2C:
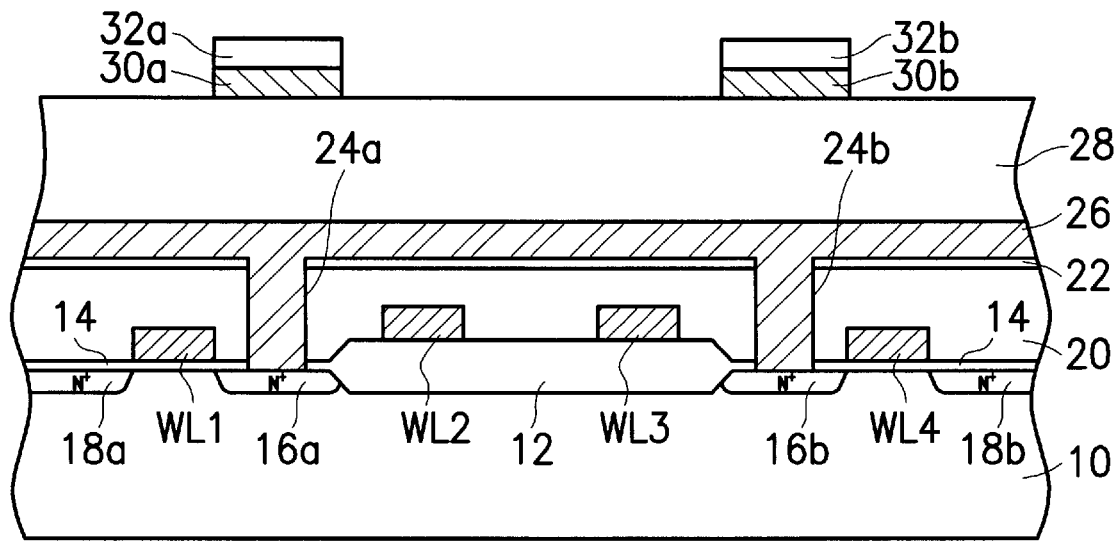

Referring next to FIG. 2C, in the subsequent step CVD is performed to successively deposit an insulating layer and a sacrificial polysilicon layer. Then, a conventional photolithography and etching process is performed to etch away selected portions of the insulating layer and the sacrificial polysilicon layer, so as to form solid cylindrical insulating layers 30a, 30b and sacrificial polysilicon layers 32a, 32b as shown in the drawing. The insulating layers 30a, 30b can be, for example, silicon nitride layers deposited to a thickness of approximately 1000 Å. The thickness of the sacrificial polysilicon layers 32a, 32b can be approximately 1000 Å, for example. The insulating layer 30a and the sacrificial polysilicon layer 32a in combination form a stack layer 30a, 32a which is preferably located above the corresponding drain region 16a. Similarly, the insulating layer 30b and the sacrificial polysilicon layer 32b in combination form another stack layer 30b, 32b, which is preferably located above the corresponding drain region 16b.

Figure 2D:
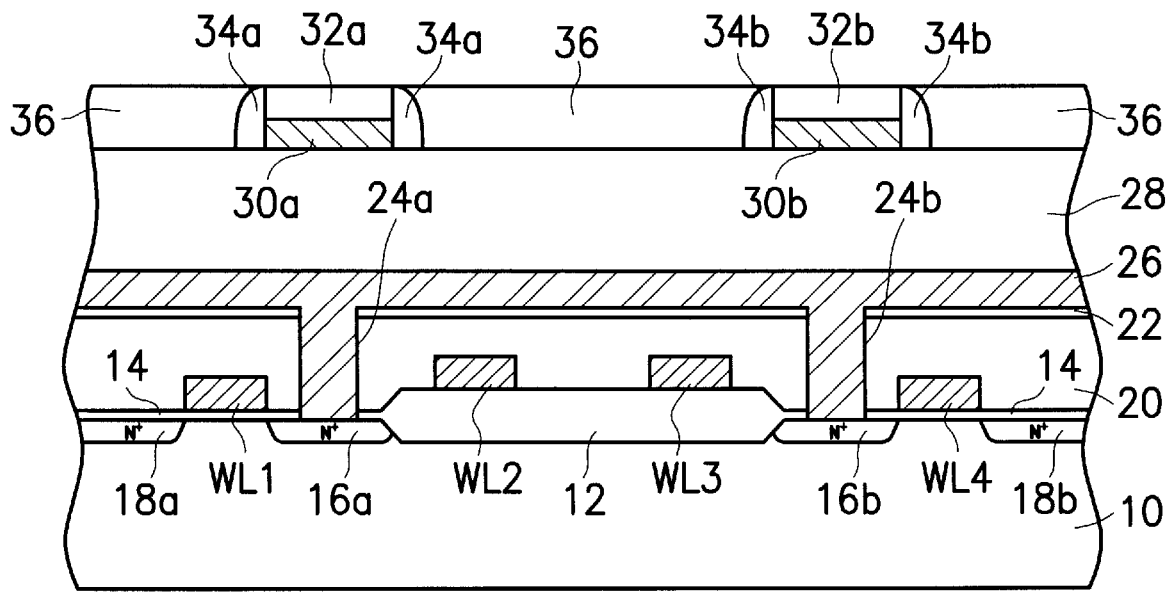

Referring next to FIG. 2D, in the subsequent step, silicon dioxide spacers 34a and 34b are formed on the sidewalls of the stack layers 20a, 32a and 30b, 32b, respectively. In this embodiment, the silicon dioxide spacers 34a and 34b can be formed by the following steps: first, depositing a silicon dioxide layer to a thickness of approximately 1000 Å, for example, then etching back the silicon dioxide layer. After that, CVD is performed to deposit an insulating layer 36, for example, a silicon nitride layer, to a thickness of approximately 2000 Å, for example. Then, a chemical-mechanical polishing (CMP) technique is used to polish the insulating layer 36 until the top surfaces of the stack layers 30a, 32a and 30b, 32b are exposed.

Figure 2E:
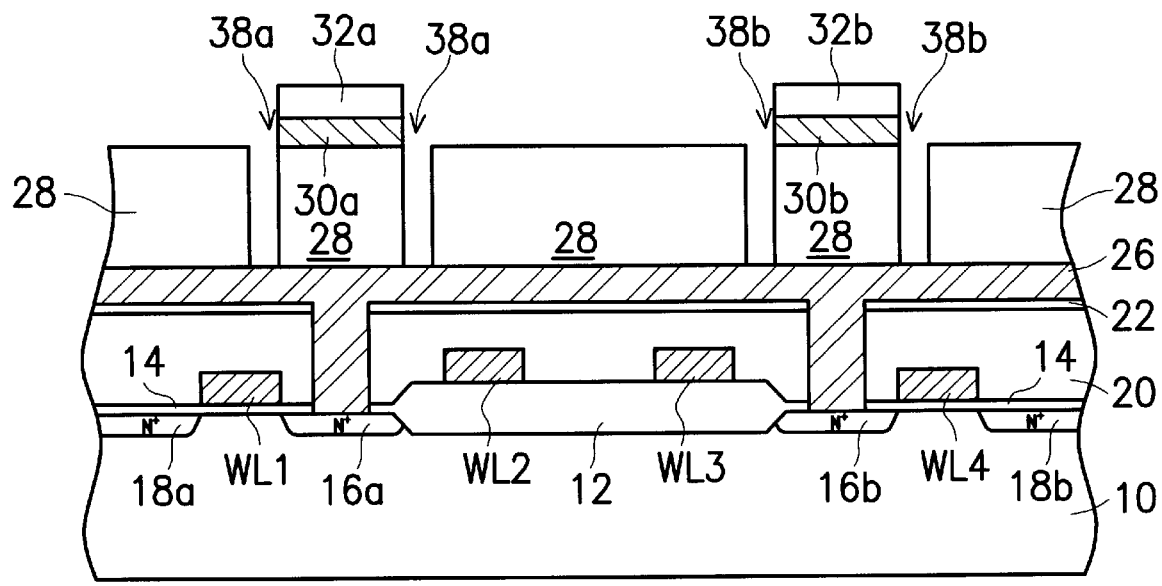

Referring next to FIG. 2E, in the subsequent step the silicon dioxide spacers 34a and 34b are etched away using the stack layers 30a, 32a and 30b, 32b and the insulating layer 36 as masking layers. Thereafter, with the same stack layers 30a, 32a and 30b, 32b and the insulating layer 36 as masks, the insulating layer 28 is etched until the surface of the polysilicon layer 26 is exposed. Then, using the sacrificial polysilicon layers 32a, 32b as masks, the insulating layer 36 is removed. Thus, openings 38a and 38b are formed.

Figure 2F:
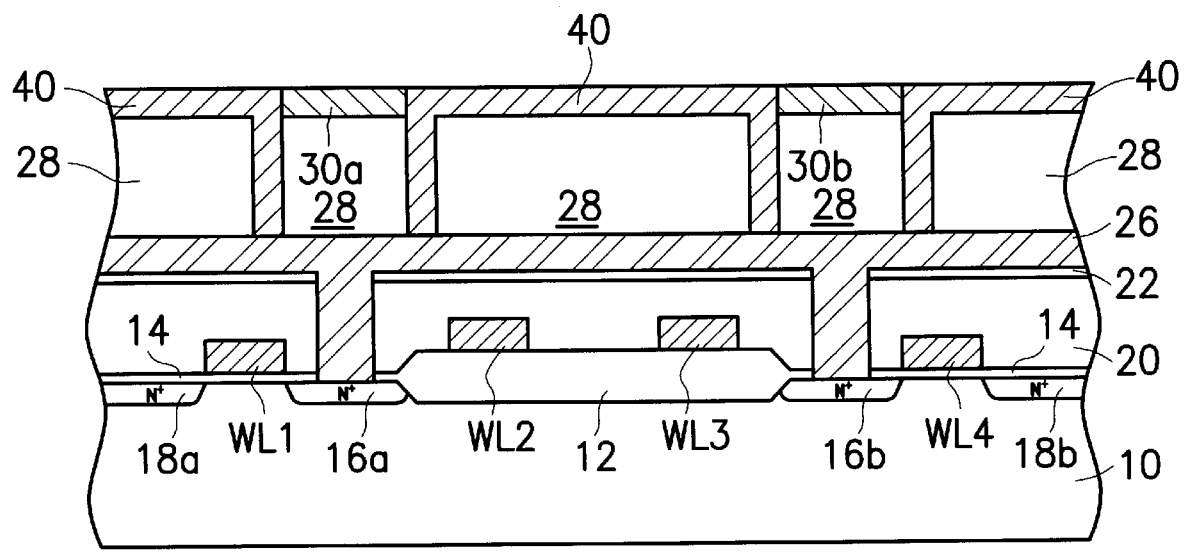

Referring next to FIG. 2F, in the subsequent step a polysilicon layer 40 is deposited on the surfaces of the stack layers 30a, 32a and 30b, 32b and the insulating layer 28 to a thickness of approximately 1000 Å, for example, and also filling the openings 38a and 38b. To increase the conductivity of the polysilicon layer 40, arsenic ions, for example, can be implanted into the polysilicon layer 40. Then, the polysilicon layer 40 and the sacrificial polysilicon layers 32a, 32b are polished by CMP until the top surfaces of the insulating layers 30a, 30b are exposed.

Figure 2G:
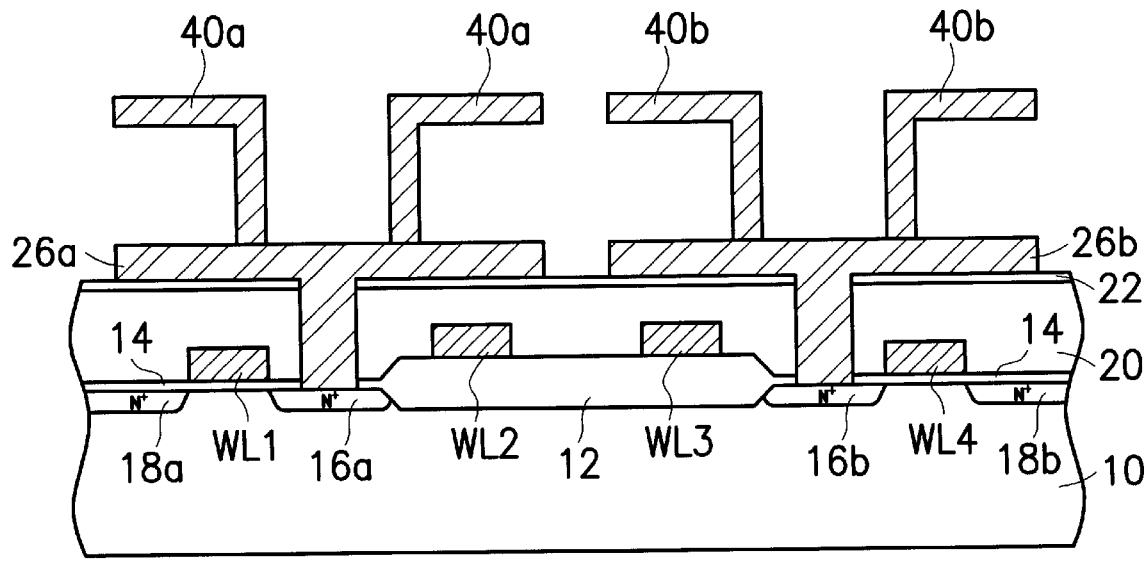

Referring next to FIG. 2G, in the subsequent step, with the polysilicon layer 40 as a mask, wet etching is performed so as to remove the insulating layers 30a, 30b and then the insulating layer 28 below. Thereafter, a conventional photolithography and etching process is performed to etch, in sequence, the polysilicon layer 40, the insulating layer 28, and the polysilicon layer 26, so as to define the storage electrodes of the charge storage capacitors in each memory unit. Through the aforementioned steps, the polysilicon layers 40 and 26 are divided into sections 40a, 40b and 26a, 26b. Then, a wet etching process is again performed on the wafer with the etching protection layer 22 as the etch end point, so as to remove the remainder of the insulating layer 28. The fabrication of the storage electrodes of the charge storage capacitors in the DRAM is thus complete. As shown in FIG. 2G, each storage electrode includes a trunk-like polysilicon layer 26a/26b and a branch-like polysilicon layer 40a/40b having an L-shaped cross section. The trunk-like polysilicon layers 26a, 26b are electrically coupled to the drain regions 16a and 16b the transfer transistors in the DRAM, respectively, and each have a T-shaped cross section. The branch-like polysilicon layers 40a, 40b generally have a hollow cylindrical shape, although the horizontal cross section can be circular, rectangular, or any other shape, depending on the shapes of the respective stack layers 30a, 32a and 30b, 32b.

The branch-like polysilicon layers 40a and 40b first extend vertically upward from the upper surfaces of the trunk-like polysilicon layers 26a, 26b for a certain distance, and then extend horizontally in an outward direction. Due to the particular shape of the storage electrode of the capacitor of the invention, the storage electrodes are hereinafter referred to as "tree-like storage electrodes", and the capacitors thus constructed are referred to as "tree-type charge storage capacitors".

Figure 2H:
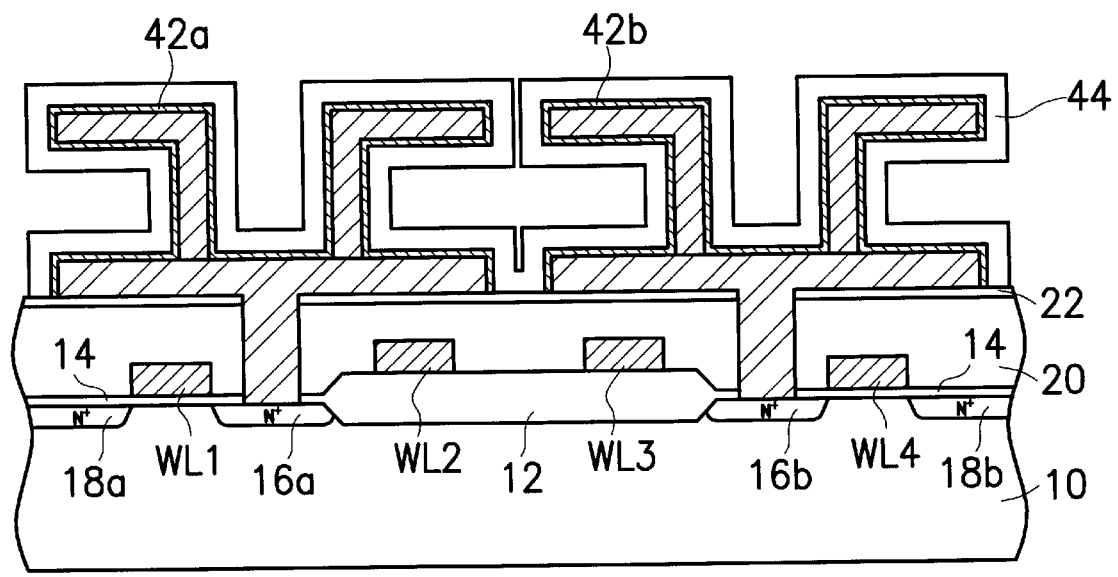

Referring next to FIG. 2H, in the subsequent step dielectric films 42a, 42b are respectively formed over the exposed surfaces of storage electrode 26a, 40a and 26b, 40b. The dielectric films 42a, 42b can be formed of, for example, silicon dioxide, silicon nitride, NO (silicon nitride/silicon dioxide), ONO (silicon dioxide/silicon nitride/silicon dioxide), or the like. Next, an opposing electrode 44 of polysilicon is formed over the surfaces of dielectric films 42a, 42b. The process for forming the opposing electrode 44 includes a first step of depositing a polysilicon layer by CVD to a thickness of, for example, approximately 1000 Å, a second step of diffusing N-type impurities into the polysilicon layer so as to increase the conductivity, and a third step of performing a conventional photolithography and etching process to etch away selected parts of the polysilicon layer. The fabrication of the tree-type charge storage capacitor in the DRAM is then complete.

Although not shown in FIG. 2H, to complete the fabrication of the DRAM chip, subsequent steps include fabricating bit lines, bonding pads, interconnections, passivations, and packaging. These steps involve only conventional techniques and are not included within the spirit and scope of the invention, so a detailed description will not be provided herein.

Second Preferred Embodiment

In the foregoing first embodiment, the trunk-like polysilicon layer has a solid structure with a T-shaped cross section. In the following embodiment, a different fabricating method is used to form a storage electrode with a different structure in which the trunk-like polysilicon layer has a hollow structure, so as to increase the surface area of the storage electrode.

FIGS. 3A through 3E illustrate a second embodiment of a semiconductor memory device having a tree-type charge storage capacitor according to the invention. This embodiment of the semiconductor memory device can be produced by a second preferred method for fabricating a semiconductor memory device according to the invention.

The tree-type storage electrode of the second embodiment is based on the wafer structure of FIG. 2A, using a different fabricating method to produce a DRAM storage electrode with a different structure. Elements in FIGS. 3A through 3E that are identical to those in FIG. 2A are labeled with the same numerals.

Figure 3A:
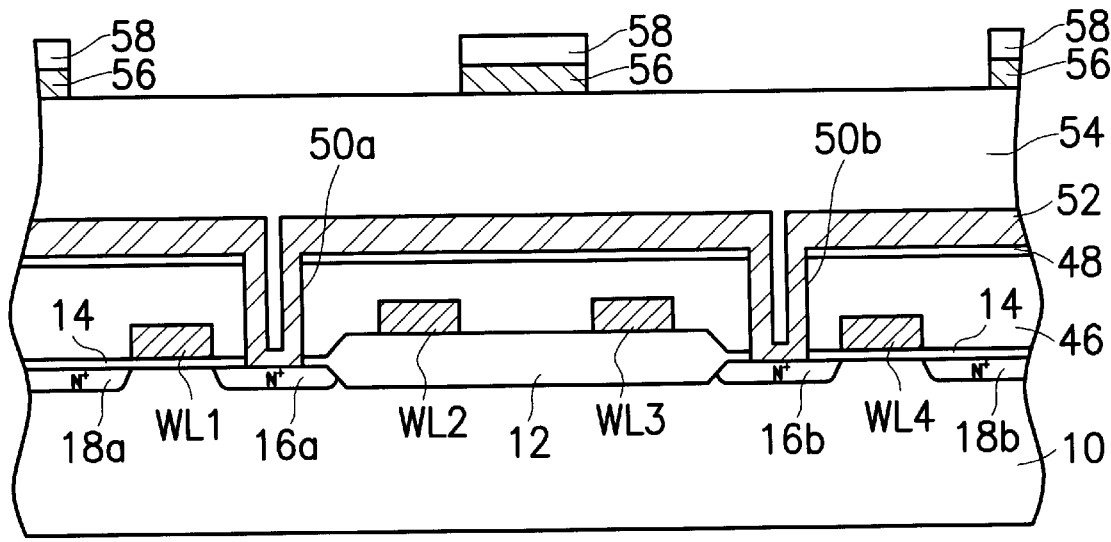
FIGS. 3A through 3E are cross-sectional views illustrating a second embodiment of a semiconductor memory device according to the invention, and a method for fabricating the same according to the invention.

Referring to FIG. 3A together with FIG. 2A, CVD is performed to deposit an insulating layer 46, for example, BPSG, to a thickness of approximately 7000 Å. Then, an etching protection layer 48 of, for example, silicon nitride is deposited, having a thickness of approximately 1000 Å. Thereafter, a conventional photolithography and etching process is performed to etch selected portions of, in sequence, the etching protection layer 48, the insulating layer 46, and the gate oxide layer 14, so as to form storage electrode contact holes 50a and 50b which extend from the top surface of the etching protection layer 48 to the top surface of the drain regions 16a and 16b. Next, a polysilicon layer 52 is deposited on the etching protection layer 48. Then, a thick insulating layer 54, for example, a silicon dioxide layer, is deposited on the surface of the polysilicon layer 52 to a thickness of approximately 7000 Å. CVD is again performed to deposit an insulating layer and a sacrificial polysilicon layer successively on top of the insulating layer 54, and then a conventional photolithography and etching process is performed to define the insulating layer and the sacrificial polysilicon layer, so as to form the insulating layer 56 and the sacrificial polysilicon layer 58 as shown in the drawing. The insulating layer 56 can be, for example, a silicon nitride layer deposited to a thickness of approximately 1000 Å, for example. The insulating layer 56 and the sacrificial polysilicon layer 58 in combination form a stack layer 56, 58, which is preferably located above and in a position in between two adjacent charge storage capacitors.

Figure 3B:
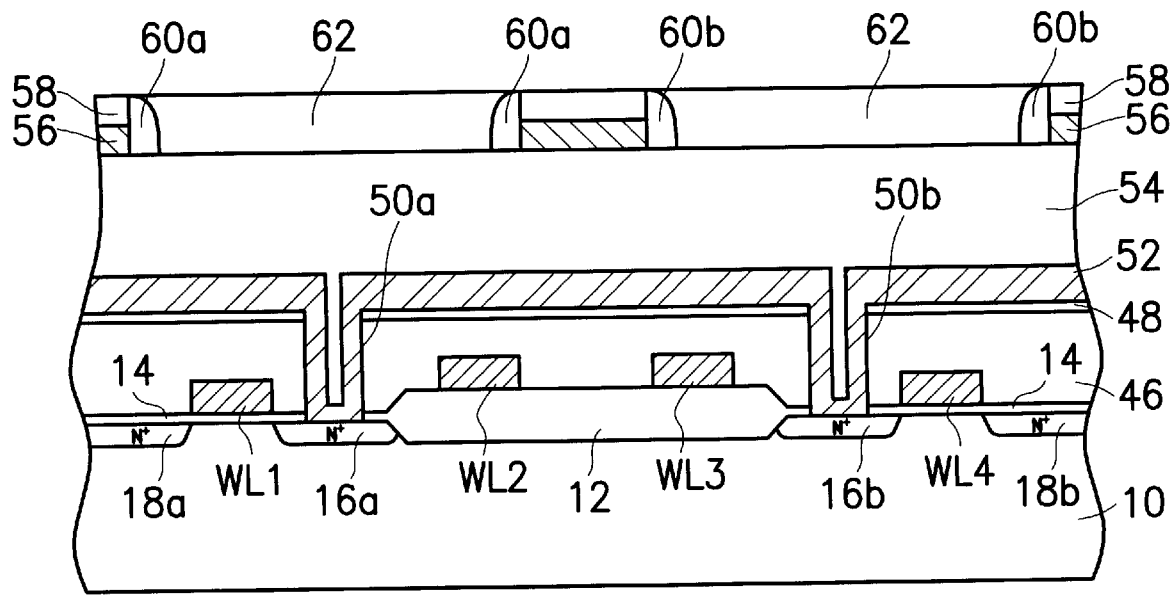

Referring next to FIG. 3B, in the subsequent step silicon dioxide spacers 60a and 60b are formed on the respective sidewalls of the stack layer 56, 58. In this embodiment, the silicon dioxide spacers 60a and 60b can be formed by the following steps: first, depositing a silicon dioxide layer to a thickness of approximately 1000 Å, then etching back the silicon dioxide layer. Thereafter, CVD is performed to deposit an insulating layer 62, for example, a silicon nitride layer to a thickness of approximately 2000 Å. Then, CMP is performed, to polish the insulating layer 62 until at least the upper surface of the stack layer 56, 58 is exposed.

Figure 3C:
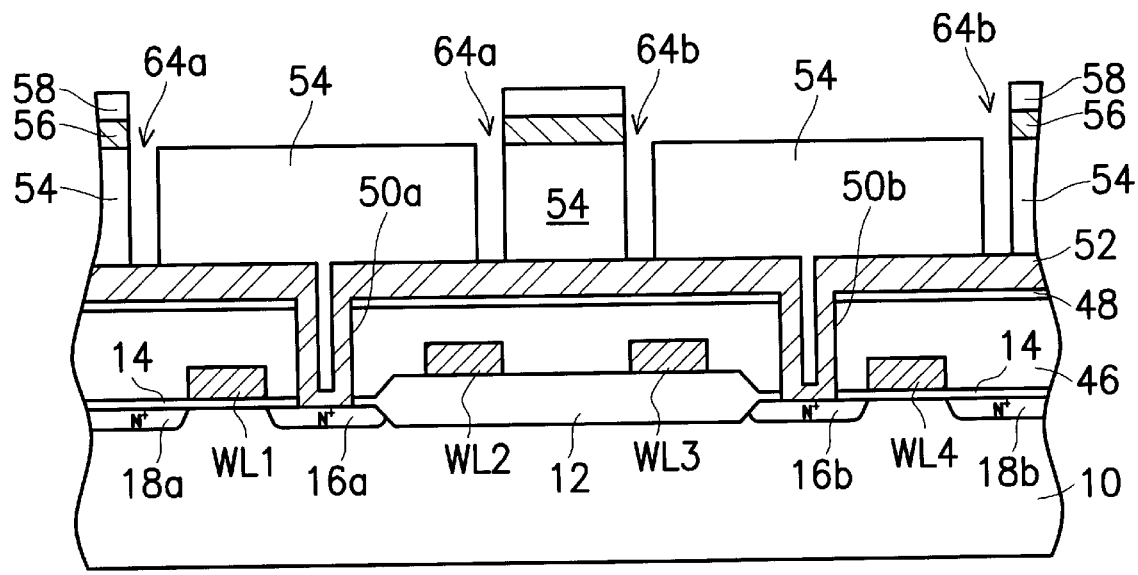

Referring next to FIG. 3C, in the subsequent step, using the stack layers 56, 58 and insulating layer 62 as etching masks, the silicon dioxide spacers 60a and 60b are etched away. After that, again with the stack layers 56, 58 and the insulating layer 62 as the etching masks, the insulating layer 54 is etched until the surface of the polysilicon layer 52 is reached. Then, using the sacrificial polysilicon layer 58 as an etching mask, the insulating layer 62 is etched away. Thus, openings 61 and 64b are formed.

Figure 3D:
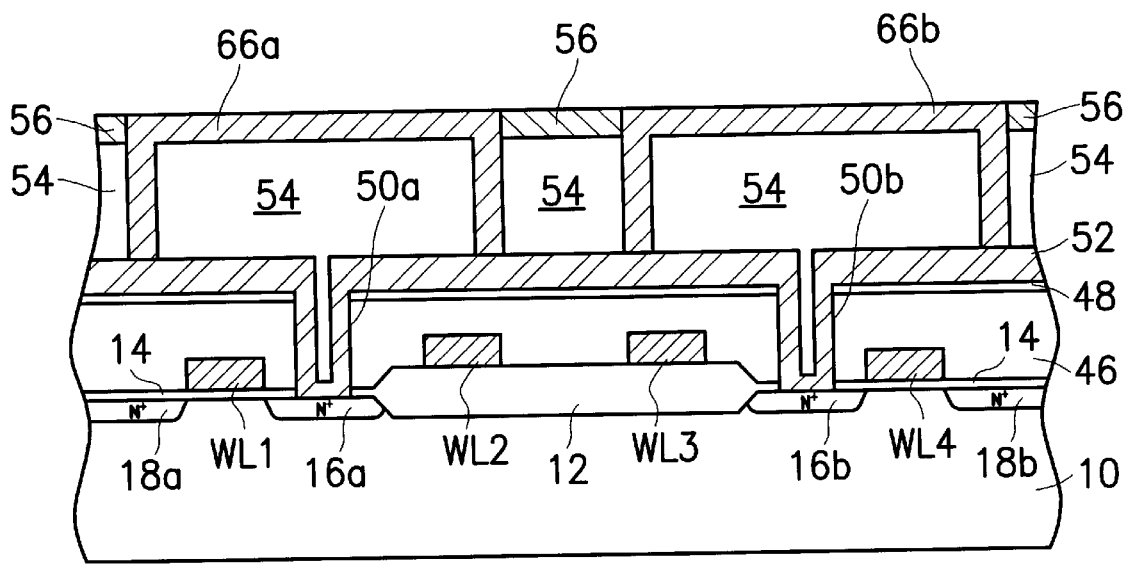

Referring next to FIG. 3D, a layer of polysilicon 66, for example, having a thickness of approximately 1000 Å, is deposited on the surfaces of the stack layers 56, 58 and the insulating layer 54, and also filling openings 64a and 64b. Then, CMP is performed to polish the polysilicon layer and the sacrificial polysilicon layers 58 until at least the upper surface of the insulating layer 56 is exposed, so as to form polysilicon layers 66a and 66b. To increase the conductivity of the polysilicon layers, arsenic ions, for example, can be implanted into the polysilicon layers.

Figure 3E:
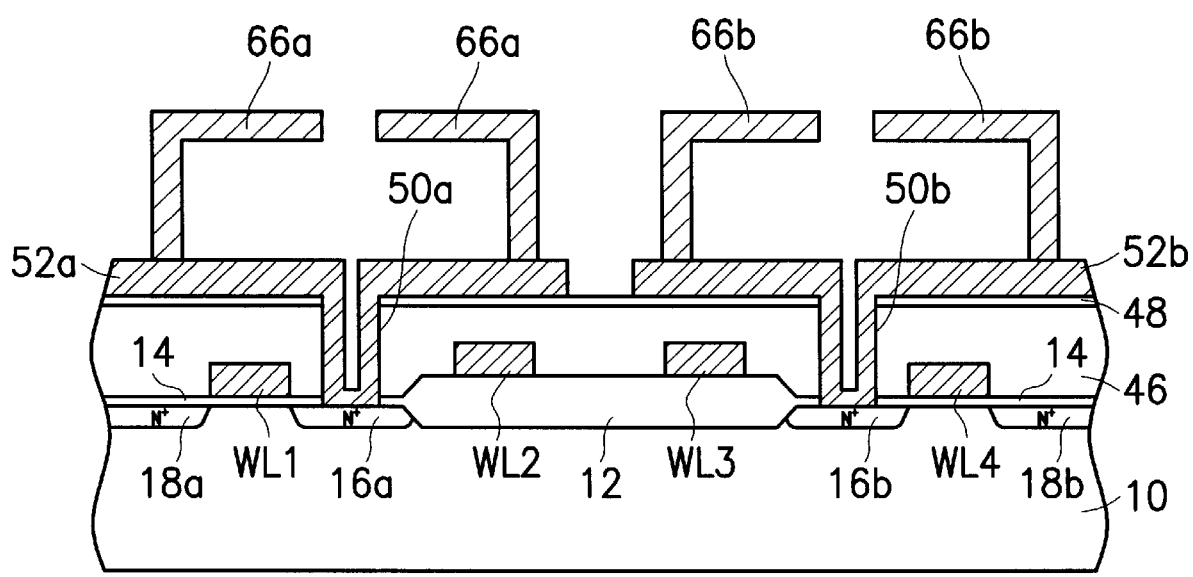

Referring next to FIG. 3E, in the subsequent step, using the polysilicon layers 66a and 66b as masks, a wet etching process is performed to remove successively the insulating layer 56 and the insulating layer 54 below. Thereafter, a conventional photolithography and etching process is performed to etch the polysilicon layers 66a, 66b and the polysilicon layer 52, so as to define the storage electrodes of the charge storage capacitors in each memory unit. The polysilicon layers 66a, 66b are etched above respective drain regions 16a, 16b. The polysilicon layer 52 is etched between the drain regions 16a, 16b. Through the aforementioned steps, the polysilicon layers 66a, 66b and 52 are divided into sections 66a, 66b and 52a, 52b. Then, a wet etching process is again performed on the wafer using the etching protection layer 48 as the etch end point, so as to remove the remainder of the insulating layer 54. The fabrication of the storage electrodes of the charge storage capacitors in the DRAM is thus complete. As shown in FIG. 3E, the storage electrode includes a trunk-like polysilicon layer 52a/52b and a branch-like polysilicon layer 66a/66b having an L-shaped cross section. The trunk-like polysilicon layers 52a, 52b are electrically coupled to the drain regions 16a and 16b of the transfer transistors in the DRAM, respectively, and have a U-shaped cross section. The branch-like polysilicon layers 66a, 66b generally have a hollow cylindrical shape, although the horizontal cross section can be circular, rectangular, or any other shape. The branch-like polysilicon layers 66a, 66b first extend vertically up a certain distance from the upper peripheral surface of the trunk-like polysilicon layers 52a, 52b, and then extend horizontally in an inward direction. Subsequent processing steps do not differ from conventional processes, and therefore are not described herein.

Third Preferred Embodiment

The foregoing first and second embodiments have branch-like electrode layers with L-shaped cross sections. In cross section, the branch-like electrode layers form two such branches. However, the invention is not limited to such a configuration. The number of L-shaped branches shown in a cross section of the branch-like electrode layer can be just one. In the following embodiment, a storage electrode having a branch-like electrode having a single L-shaped cross section branch is described.

Figure 4:
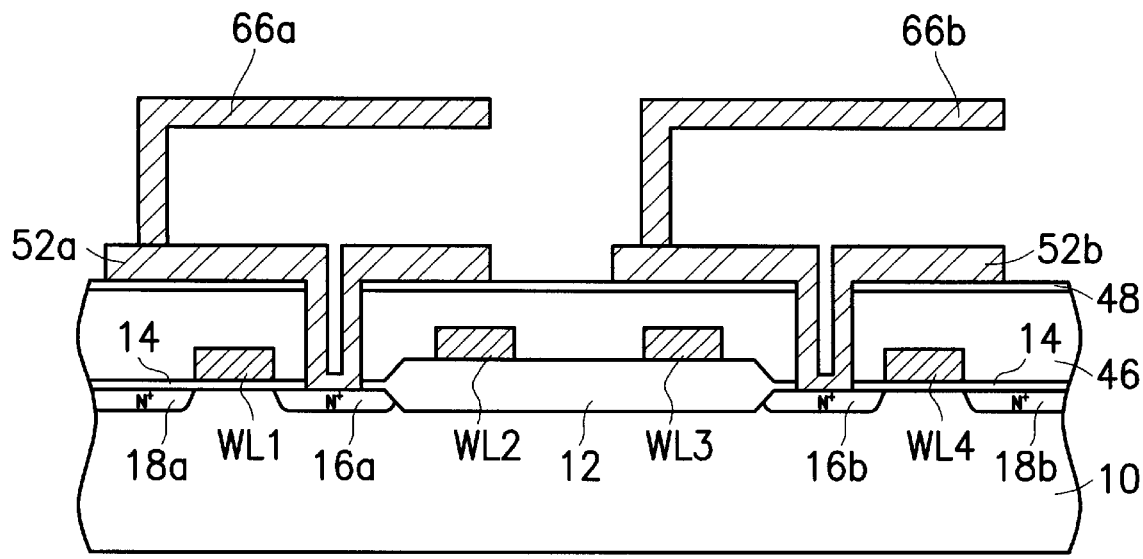
FIG. 4 is a cross-sectional view illustrating a third embodiment of a semiconductor memory device according to the invention, and a method for fabricating the same according to the invention.

FIG. 4 shows a third embodiment of a semiconductor memory device having a tree-type charge storage capacitor according to the invention. This embodiment of the semiconductor memory device can be produced by a third preferred method for fabricating a semiconductor memory device according to the invention.

The tree-type storage electrode of the third embodiment is based on the wafer structure of FIG. 3D, and uses a different fabricating method to produce a DRAM storage electrode with a different structure. Elements in FIG. 4 that are identical to those in FIG. 3D are labeled with the same numerals.

Referring to FIG. 3D together with FIG. 4, with polysilicon layers 66a, 66b as masks, a wet etching process is performed to remove, in sequence, the insulating layer 56 and the insulating layer 54 below. Thereafter, a conventional photolithography and etching process is performed to etch the polysilicon layers 66a, 66b and the polysilicon layer 52, so as to define a storage electrode of the charge storage capacitor in each memory unit. The polysilicon layers 66a, 66b are etched to remove a vertical end of each layer. The polysilicon layer 52 is etched to remove a portion between drain regions 16a, 16b. Through the aforementioned steps, the polysilicon layer 52 is divided into sections 52a and 52b, and the polysilicon layers 66a and 66b have only one end connected to the respective polysilicon layers 52a and 52b. Then, a wet etching process is again performed, using the etching protection layer 48 as the etch end point, to remove the remaining insulating layer 54. The fabrication of the storage electrodes of the charge storage capacitors in the DRAM is thus complete. As shown in FIG. 4, the storage electrode includes a trunk-like polysilicon layer 52a/52b, and a branch-like polysilicon layer 66a/66b having an L-shaped cross section. The trunk-like polysilicon layers 52a, 52b are electrically coupled to the drain regions 16a and 16b of the transfer transistors in the DRAM, respectively, and have T-shaped cross sections. The branch-like polysilicon layers 66a, 66b each have only a single branch with an L-shaped cross section and first extend vertically up a certain distance from the upper peripheral edge of the trunk-like polysilicon layers 52a, 52b, and then extend horizontally toward another peripheral edge of the respective trunk-like polysilicon layer 52a, 52b. Subsequent processing steps do not differ from conventional processes, and therefore are not further described here.

Fourth Preferred Embodiment

In the foregoing first, second, and third embodiments, the storage electrode has only a single branch-like electrode layer with an L-shaped cross section. However, the number of branch-like electrode layers with L-shaped cross sections is not limited to just on, and can be two, three, or more for each storage electrode. In the following embodiment, a storage electrode with two branch-like electrode layers, each having an L-shaped cross section, is described.

FIGS. 5A through 5D illustrate a fourth embodiment of a semiconductor memory device having a tree-type charge storage capacitor according to the invention. This embodiment of the semiconductor memory device can be constructed by a fourth preferred method for fabricating a semiconductor memory device according to the invention.

The tree-type storage electrode of the fourth embodiment is based on the wafer structure of FIG. 2F, using a different fabricating method to produce a DRAM storage electrode with a different structure. Elements in FIGS. 5A through 5D that are identical to those in FIG. 2F are labeled with the same numerals.

Figure 5A:
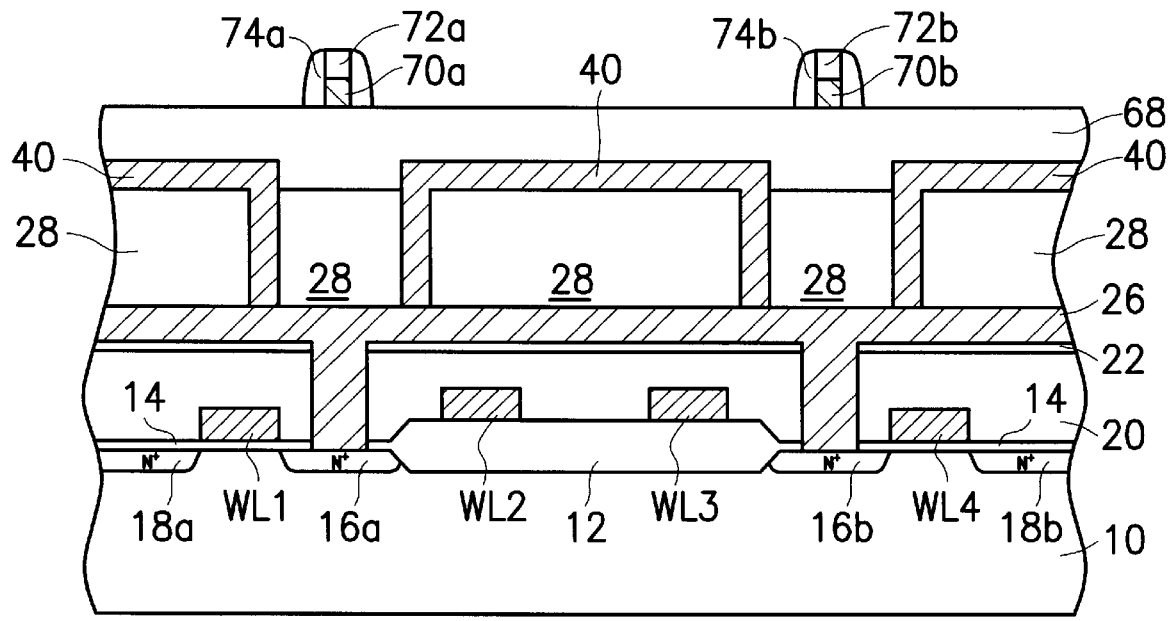
FIGS. 5A through 5D are cross-sectional views illustrating a fourth embodiment of a semiconductor memory device according to the invention, and a method for fabricating the same according to the invention.

Referring to FIG. 2F together with FIG. 5A, in the subsequent step, using the polysilicon layer 40 as mask, a wet etching process is performed to remove the insulating layers 30a, 30b. Thereafter, an insulating layer 68 of, for example, silicon dioxide, is deposited on the surfaces of polysilicon layer 40 and the insulating layer 28. Then, an insulating layer and a sacrificial polysilicon layer are sequentially deposited on the surface of insulating layer 68. Using a conventional photolithography and etching process, the insulating layer and the sacrificial polysilicon layer are defined so as to form the insulating layers 70a, 70b and sacrificial polysilicon layers 72a, 72b shown in the drawing. The insulating layers 70a, 70b can be, for example, a silicon nitride layer deposited to a thickness of approximately 1000 Å. The sacrificial polysilicon layers 72a, 72b are disposed to a thickness of approximately 1000 Å, for example. The insulating layer 70a and the sacrificial polysilicon layer 72a together form a stack layer 70a, 72a, which is preferably located above the corresponding drain region 16a. Similarly, the insulating layer 70b and the sacrificial polysilicon layer 72b together form another stack layer 70b, 72b, which is preferably located above the corresponding drain region 16b. Next, silicon dioxide spacers 74a and 74b are formed on the respective sidewalls of the stack layers 70a, 72a, and 70b, 72b. In this embodiment, the silicon dioxide spacers 74a and 74b can be formed by the following steps: first, depositing a silicon dioxide layer to a thickness of approximately 1000 Å, for example, then etching back the silicon dioxide layer.

Figure 5B:
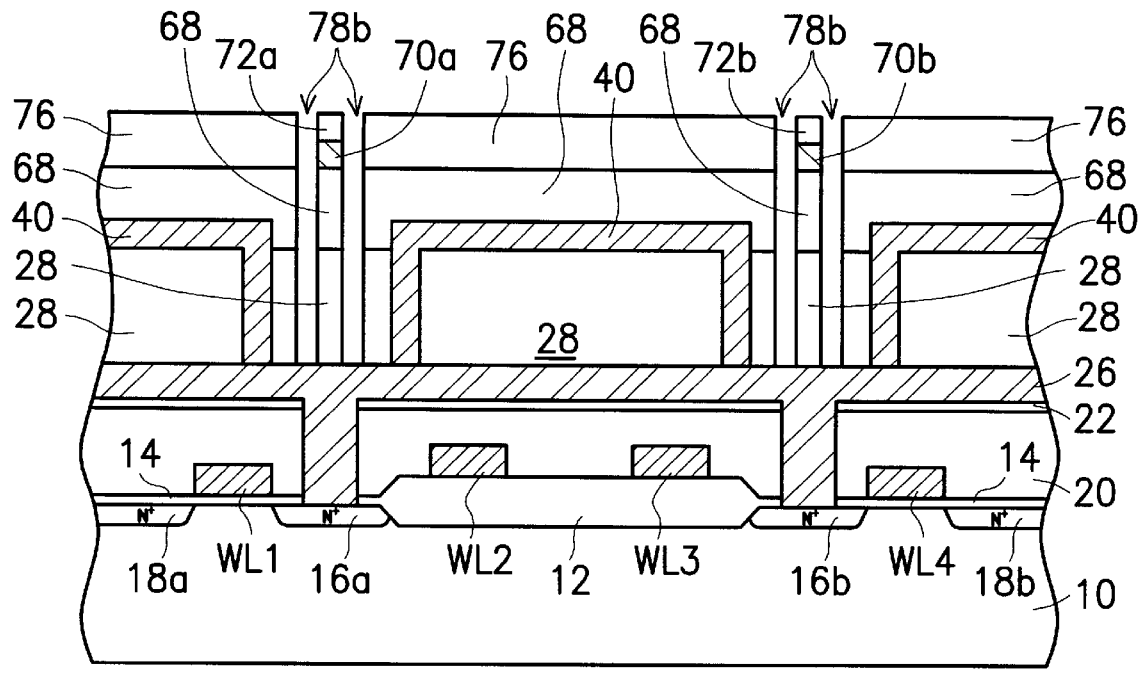

Referring next to FIG. 5B, in the subsequent step CVD is performed to deposit an insulating layer 76 of, for example, silicon nitride to a thickness of approximately 2000 Å. Then, CMP is performed to polish the insulating layer 76 until at least the top surfaces of the stack layers 70a, 72a and 70b, 72b are exposed. After that, using the stack layers 70a, 72a and 70b, 72b and the insulating layer 76 as etching masks, the silicon dioxide spacers 74a and 74b are removed by etching. Then, using the stack layers 70a, 72a and 70b, 72b and the insulating layer 76 as etching masks again, the insulating layers 68 and 28 are etched until the surface of the polysilicon layer 26 is reached, so as to form openings 78a and 78b.

Figure 5C:
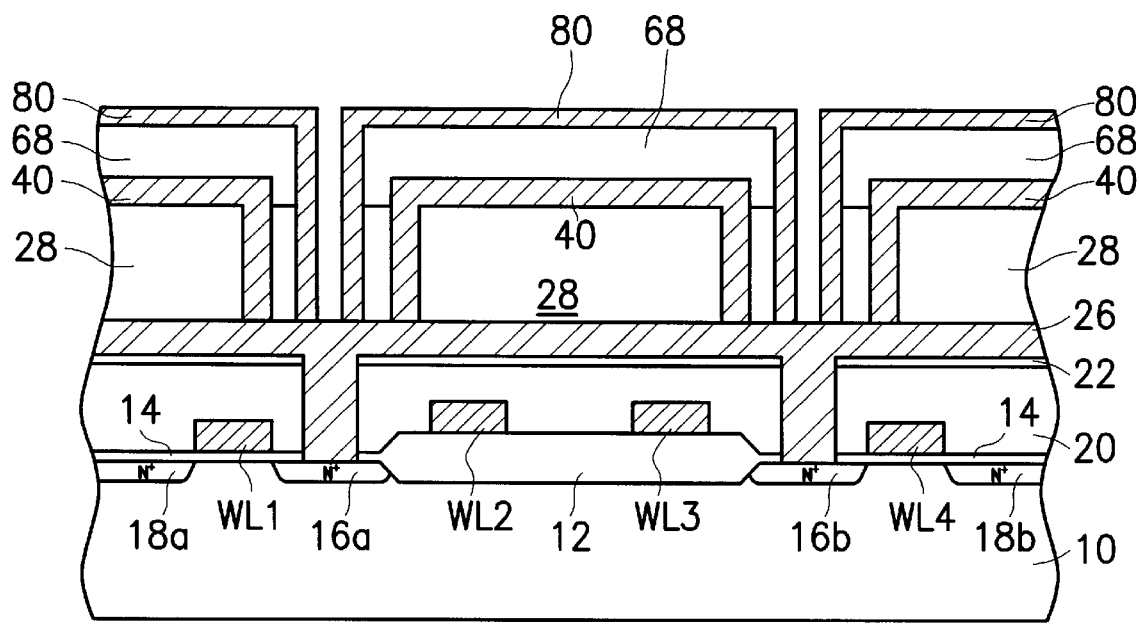

Referring next to FIG. 5C, in the subsequent step, using the sacrificial polysilicon layers 72a, 72b as etching masks, the insulating layer 76 is removed by etching. Then, a polysilicon layer 80 is deposited on the surfaces of the stack layers 70a, 72a and 70b, 72b and the insulating layer 68, to a thickness of approximately 1000 Å, for example, also filling the openings 78a and 78b. To increase the conductivity of the polysilicon layer 80, arsenic ions, for example, can be implanted into the polysilicon layer 80. Next, CMP is performed to polish the polysilicon layer 80 and the sacrificial polysilicon layers 72a, 72b until at least the top surfaces of the insulating layers 70a, 70b are exposed. Then, using the polysilicon layer 80 as a mask, wet etching is performed to remove, in sequence, the insulating layers 70a, 70b and the insulating layers 68 and 28 below.

Figure 5D:
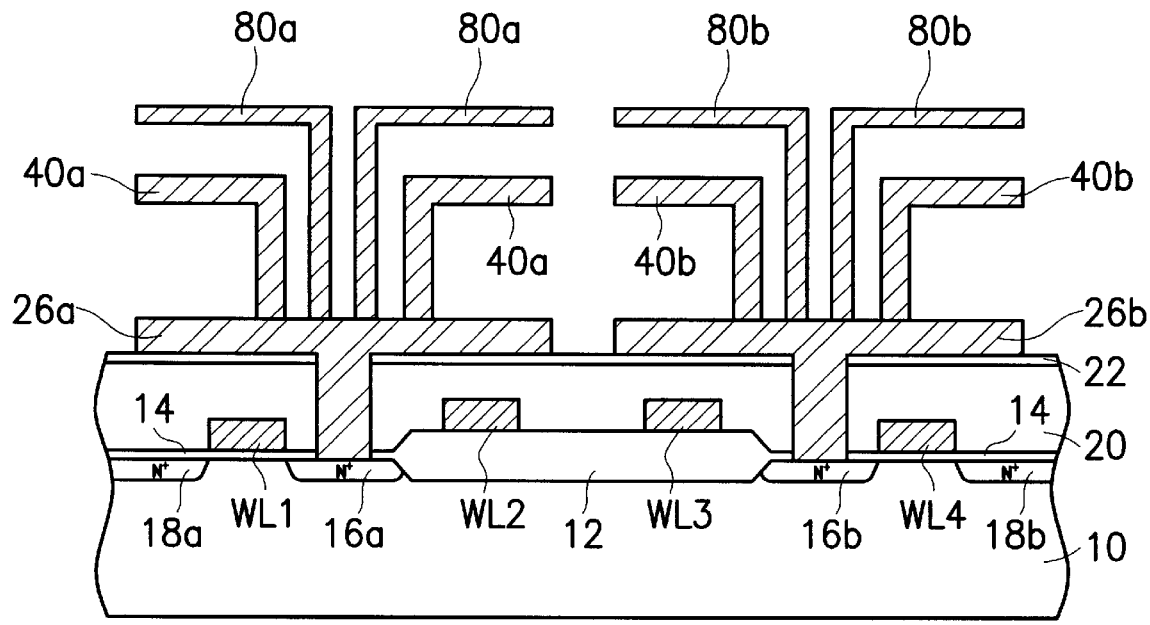

Referring next to FIG. 5D, in the subsequent step a conventional photolithography and etching process is performed to successively etch the polysilicon layer 80, the insulating layer 68, the polysilicon layer 40, the insulating layer 28, and the polysilicon layer 26, so as to define a storage electrode of the charge storage capacitor in each memory unit. That is, through the aforementioned steps, the polysilicon layers 80, 40, and 26 are divided into sections 80a, 80b; 40a, 40b; and 26a, 26b as shown in the drawing. Next, a wet etching process is performed to remove the remaining insulating layers 68 and 28, using the etching protection layer 22 as the etch end point. The fabrication of a storage electrode of a charge storage capacitor in a DRAM is thus complete. As shown in FIG. 5D, the storage electrode includes a trunk-like polysilicon layer 26a/26b and two branch-like polysilicon layers 80a/80b and 40a/40b, each having an L-shaped cross section. The trunk-like polysilicon layers 26a, 26b are electrically coupled to the drain regions 16a and 16b of the transfer transistors in the DRAM, respectively, and have T-shaped cross sections. The two branch-like polysilicon layers 80a, 80b and 40a, 40b are in general parallel to each other and have hollow cylindrical shapes, and horizontal cross sections that can be circular, rectangular, or any other shape. The branch-like polysilicon layers 80a, 80b and 40a, 40b respectively extend vertically upward from the upper surface of the polysilicon layers 26a, 26b for a certain distance, then extend horizontally in an outward direction. Subsequent processing steps do not differ from conventional processes, and are therefore not described herein. If more than two branch-like electrode layers are required, further branches can be produced by the repeated application of stack layer formations according to the process described in connection with this embodiment.

Fifth Preferred Embodiment

In the foregoing first through fourth embodiments, the branch-like electrode layers of the storage electrode all have L-shaped cross sections. However, the invention is not limited to such a shape. The branch-like electrode layers of the storage electrode can have various other cross-sectional shapes. In the following embodiment, one branch-like electrode layer of the storage electrode has an L-shaped cross section, while another has a T-shaped cross section.

Figure 6A:
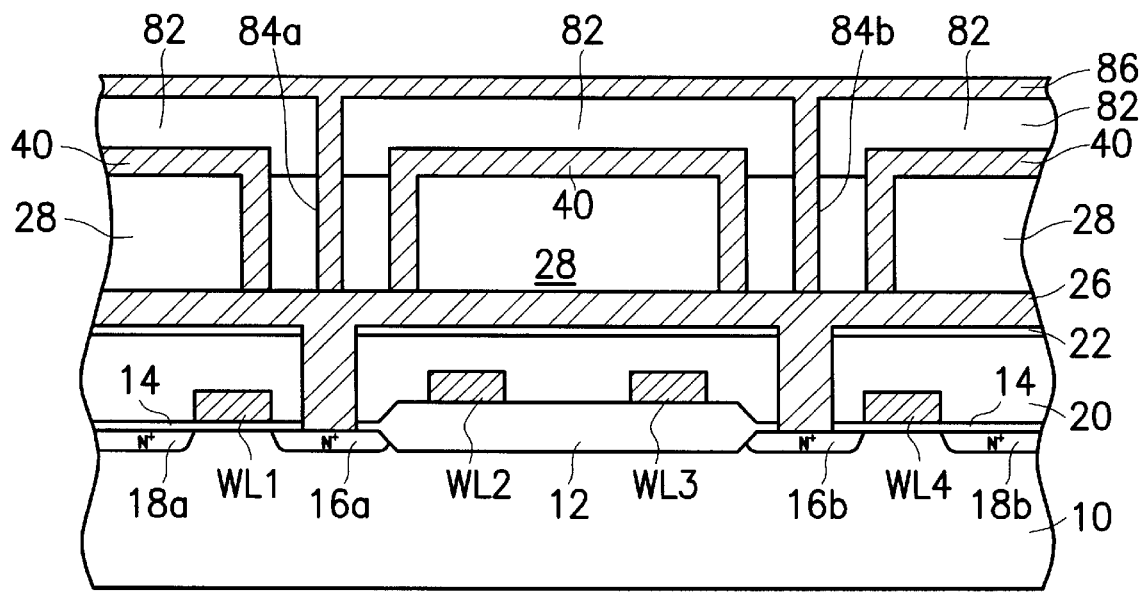
FIGS. 6A and 6B are cross-sectional views illustrating a fifth embodiment of a semiconductor memory device according to the invention, and a method for fabricating the same according to the invention.
Figure 6B:
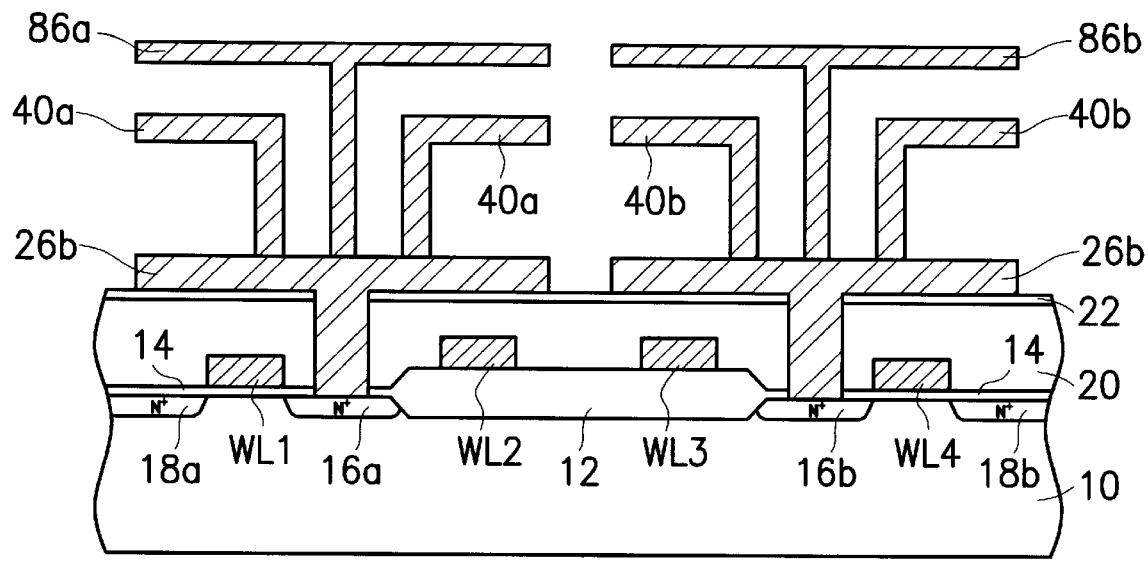

FIGS. 6A and 6B illustrate a fifth embodiment of a semiconductor memory device having a tree-type charge storage capacitor according to the invention. This embodiment of the semiconductor memory device can be constructed by a fifth preferred method for fabricating a semiconductor memory device according to the invention.

The tree-type storage electrode of the fifth embodiment is based on the wafer structure of FIG. 2F, using a different fabricating method to produce a DRAM storage electrode with a different structure. Elements in FIGS. 6A and 6B that are identical to those in FIG. 2F are labeled with the same numerals.

Referring to FIG. 2F together with FIG. 6A, in the subsequent step, using the polysilicon layer 40 as a mask, wet etching is performed to remove the insulating layers 30a, 30b. Then, CVD is performed to deposit an insulating layer 82, for example, a silicon dioxide layer, on the surfaces of the insulating layer 28 and the polysilicon layer 40. Thereafter, a conventional photolithography and etching process is performed to etch selected parts of, in sequence, the insulating layer 82 and the insulating layer 28 until the surface of the polysilicon layer 26 is reached, thereby forming openings 84a and 84b. The openings 84a and 84b are preferably respectively located in positions above the corresponding drain regions 16a and 16b. Next, CVD is performed to deposit a polysilicon layer 86, for example, to a thickness of approximately 1000 Å, on the surface of the insulating layer 82, so as to fill the openings 84a and 84b. To increase the conductivity of the polysilicon layer 86, arsenic ions, for example, can be implanted into the polysilicon layer 86.

Referring next to FIG. 6B, in the subsequent step a conventional photolithography and etching process is performed to etch, in sequence, the polysilicon layer 86, the insulating layer 82, the polysilicon layer 40, the insulating layer 28, and the polysilicon layer 26, so as to define a storage electrode of the charge storage capacitor in each memory unit. Through the aforementioned steps, the polysilicon layers 86, 40, and 26 are divided into sections 86a, 86b; 40a, 40b; and 26a, 26b, as shown in the drawing. Next, a wet etching process is performed using the etching protection layer 22 as the etch end point, to remove the insulating layers 82 and 28. The fabrication of the storage electrodes of the charge storage capacitors in the DRAM is thus complete. As shown in FIG. 6B, the storage electrode includes a trunk-like polysilicon layer 26a/26b, a branch-like polysilicon layer 40a/40b having an L-shaped cross section, and another branch-like polysilicon layer 86a/86b having a T-shaped cross section. The trunk-like polysilicon layers 26a, 26b are electrically coupled to the drain regions 16a and 16b of the transfer transistors in the DRAM, respectively, and have a T-shaped cross section. The branch-like polysilicon layers 40a, 40b having an L-shaped cross section generally have a hollow cylindrical shape, although the horizontal cross section can be circular, rectangular, or any other shape. The branch-like polysilicon layers 40a, 40b extend vertically up a certain distance from the top surface of the trunk-like polysilicon layers 26a, 26b, and then extend horizontally in an outward direction. The vertical sections of the branch-like polysilicon layers 86a, 86b generally have a hollow cylindrical shape, although the horizontal cross section can be circular, rectangular, or any other shape. The branch-like polysilicon layers 86a, 86b extend vertically up a certain distance from the top surface of the trunk-like polysilicon layers 26a, 26b, and then extend horizontally in an outward direction.

Sixth Preferred Embodiment

In the following sixth embodiment, a different method is used to form a storage electrode having a different structure. The structure of the storage electrode of this embodiment is very similar to that of the fifth embodiment. The difference lies in the branch-like polysilicon layer, which in this embodiment has a pillar structure instead of a T-shaped cross section, as in the fifth embodiment.

The tree-type storage electrode of the sixth embodiment is based on the wafer structure of FIG. 6A, using a different fabricating method to produce a DRAM storage electrode with a different structure. Elements in FIG. 7 that are identical to those in FIG. 6A are labeled with the same numerals.

Figure 7:
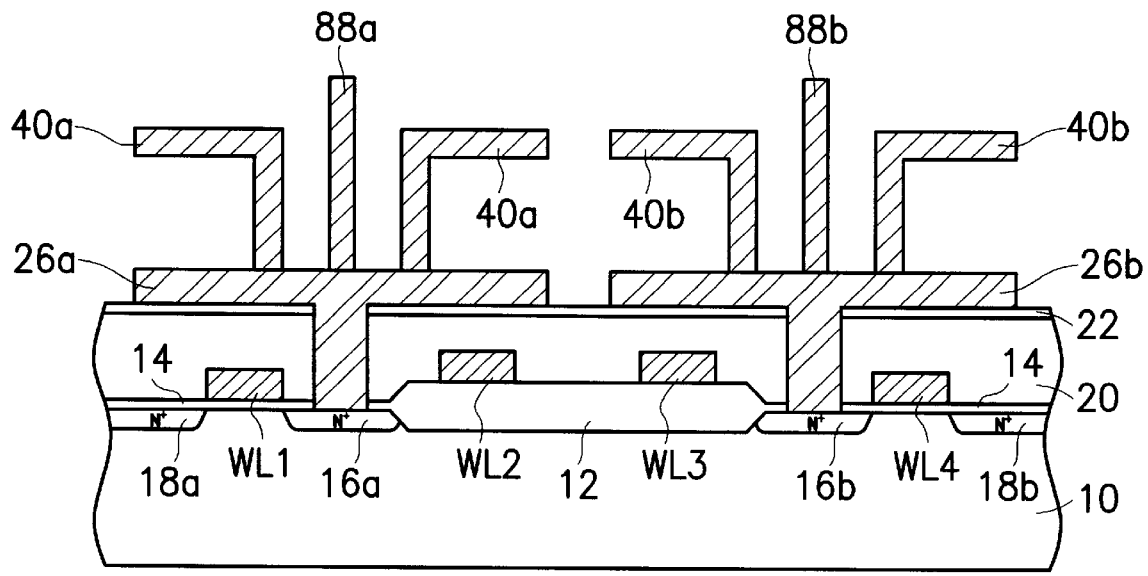
FIG. 7 is a cross-sectional view illustrating a sixth embodiment of a semiconductor memory device according to the invention, and a method for fabricating the same according to the invention.

Referring to FIG. 6A together with FIG. 7, CMP is used to polish the polysilicon layer 86 until at least the top surface of the insulating layer 82 is exposed, so as to form pillar polysilicon layers 88a and 88b as shown in the drawing. Thereafter, a wet etching process is performed using the polysilicon layer 40 as a mask to remove the insulating layer 82 and the exposed portion of the insulating layer 28. A conventional photolithigraphy and etching process is then performed to etch, in sequence, selected portions of the polysilicon layer 40, the insulating layer 28, and the polysilicon layer 26, until the surface of the etching protection layer 22 is exposed. A storage electrode of the charge storage capacitor in each memory unit is thus defined. Through the aforementioned steps, the polysilicon layers 40 and 26 are divided into sections 40a, 40b, and 26a, 26b as shown in the drawing. Next, using the etching protection layer 22 as the etch end point, a wet etching process is again performed to etch away the insulating layer 28. The fabrication of the storage electrodes of the charge storage capacitors in the DRAM is thus complete. As shown in FIG. 7, the storage electrode includes a trunk-like polysilicon layer 26a/26b, one branch-like polysilicon layer 40a/40b having an L-shaped cross section, and a pillar-shaped branch-like polysilicon layer 88a/88b. The trunk-like polysilicon layers 26a, 26b are electrically coupled to the respective drain regions 16a and 16b of the transfer transistors in the DRAM. The branch-like polysilicon layers 40a, 40b that have an L-shaped structure generally have a hollow cylindrical shape, although the horizontal cross section can be circular, rectangular, or any other shape. The branch-like polysilicon layers 40a, 40b extend vertically upward a certain distance from the top surface of the trunk-like polysilicon layers 26a, 26b, and then extend horizontally in an outward direction. The pillar-shaped branch-like polysilicon layer 88a, 88b extend vertically upward from the top surface of the trunk-like polysilicon layers 26a, and have a horizontal cross section that can be circular, rectangular, or any other shape.

Seventh Preferred Embodiment

In the foregoing first through sixth embodiments, the bottom surface of the horizontal portion of the trunk-like polysilicon layer touches the etching protection layer, and also CMP is used in the removal and sectioning of the polysilicon layer above the stack layers. However, the invention is not limited to the above. In the following embodiment, the bottom surface of the horizontal portion of the trunk-like polysilicon layer is separate from the etching protection layer below by a certain distance, so as to increase the surface area of the storage electrode. Also, an alternative technique, such as using a conventional photolithography and etching process to divide the polysilicon layer above the stack layer, is described.

FIGS. 8A through 8E illustrate a seventh embodiment of a semiconductor memory device having a tree-type charge storage capacitor according to the invention. This embodiment of the semiconductor memory device is produced by a seventh preferred method for fabricating a semiconductor memory device according to the invention.

The tree-type storage electrode of the seventh embodiment is based on the wafer structure of FIG. 2A, using a different fabrication method to produce a DRAM storage electrode with a different structure. Elements in FIGS. 8A through 8E that are identical to those in FIG. 2A are labeled with the same numerals.

Figure 8A:
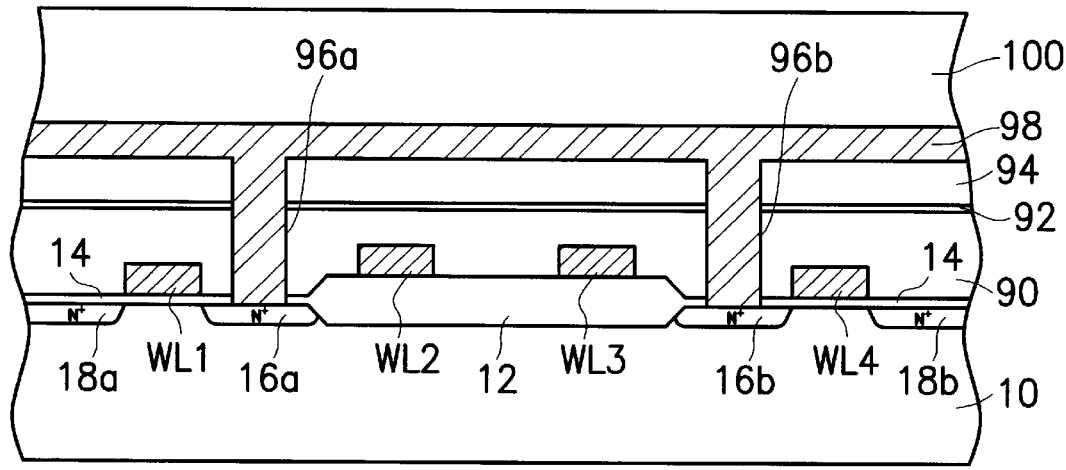
FIGS. 8A through 8E are cross-sectional views illustrating a seventh embodiment of a semiconductor memory device according to the invention, and a method for fabricating the same according to the invention.

Referring to FIG. 2A, together with FIG. 8A, CVD is performed to deposit an insulating layer 90, an etching protection layer 92, and an insulating layer 94. The insulating layer 90, for example, can be a BPSG layer deposited to a thickness of approximately 7000 Å. The etching protection layer 92, for example, can be a silicon nitride layer deposited to a thickness of approximately 1000 Å. The insulating layer 94, for example, can be a silicon dioxide layer deposited to a thickness of approximately 1000 Å. Thereafter, a conventional photolithigraphy and etching process is performed to selectively etch, in sequence, the insulating layer 94, the etching protection layer 92, the insulating layer 90, and the gate oxide layer 14. As a result, storage electrode contact holes 96a and 96b are formed. The storage electrode contact holes 96a and 96b extend from a top surface of the insulating layer 94 to a top surface of the drain regions 16a and 16b, respectively. A polysilicon layer is then deposited on the surface of the insulating layer 94 and filling the storage electrode contact holes 96a and 96b. After that, a conventional photolithigraphy and etching process is again performed to define the polysilicon layer, so as to form the polysilicon layer 98 as shown in the drawing. To increase the conductivity of the polysilicon layer, arsenic ions, for example, can be implanted into the polysilicon layer. As shown in FIG. 8A, the polysilicon layer 98 fills the storage electrode contact holes 96a and 96b and also covers the surface of the insulating layer 94. Next, an insulating layer 100, for example, a silicon dioxide layer, is deposited on the surface of the polysilicon layer 98 to a thickness of approximately 7000 Å.

Figure 8B:
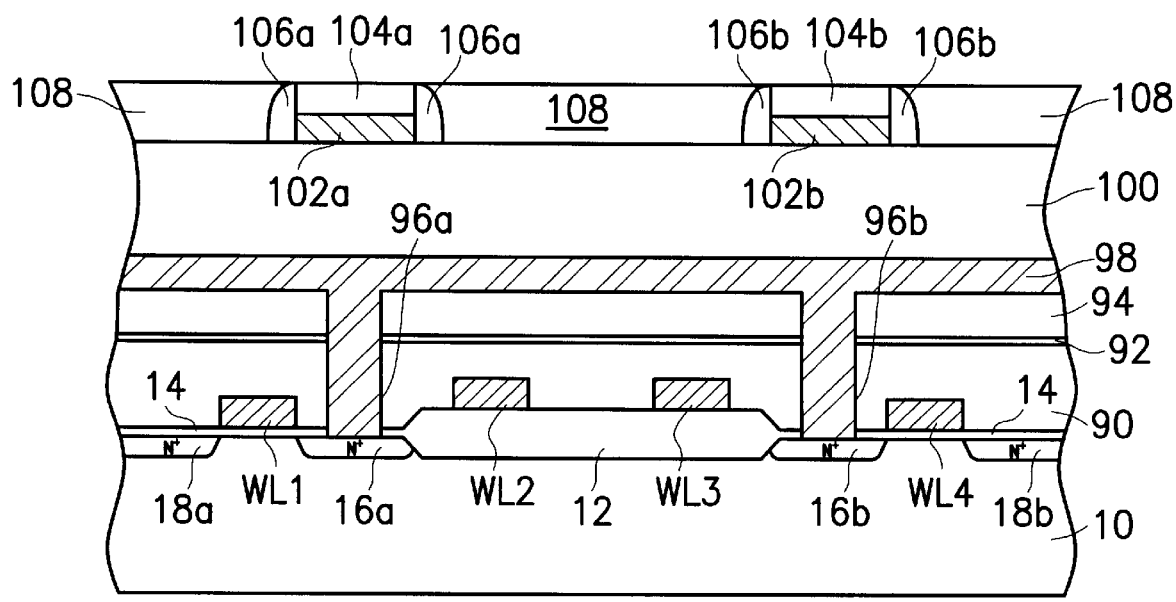

Referring next to FIG. 8B, in the subsequent step an insulating layer and a sacrificial polysilicon layer are deposited successively on the surface of the insulating layer 100. Then, a conventional photolithography and etching process is performed to define the insulating layer and the sacrificial polysilicon layer, so as to form solid cylindrically-shaped insulating layers 102a, 102b and sacrificial polysilicon layers 104a, 104b, as shown in the drawings. The horizontal cross sections of the insulating layers 102a, 102b and the sacrificial polysilicon layers 104a, 104b can be circular, rectangular, or any other shape. The insulating layers 102a, 102b can be, for example, silicon nitride layers deposited to a thickness of approximately 1000 Å. The sacrificial polysilicon layers 104a, 104b are deposited to a thickness of approximately 1000 Å, for example. The insulating layer 102a together with the sacrificial polysilicon layer 104a form a stack layer 102b, 104b, which is preferably located in a position above the corresponding drain region 16b. Likewise, the insulating layer 102b together with the sacrificial polysilicon layer 104b form a stack layer 102b, 104b, which is preferably located in a position above the corresponding drain regions 16b. Next, silicon dioxide spacers 106a, 106b are formed on the sidewalls of the stack layers 102a, 104a, and 102b, 104b, respectively. In this embodiment, the silicon dioxide spacers 106a and 106b can be formed by the following steps: first, depositing a silicon dioxide layer to a thickness of approximately 1000 Å, for example, followed by etching back the silicon dioxide layer. Thereafter, CVD is performed to deposit an insulating layer 108, for example, a silicon nitride layer to a thickness of approximately 2000 Å. Then, CMP is performed to polish the insulting layer 108, until at least the top surface of the stack layers 102a, 104a, and 102b, 104b is exposed.

Figure 8C:
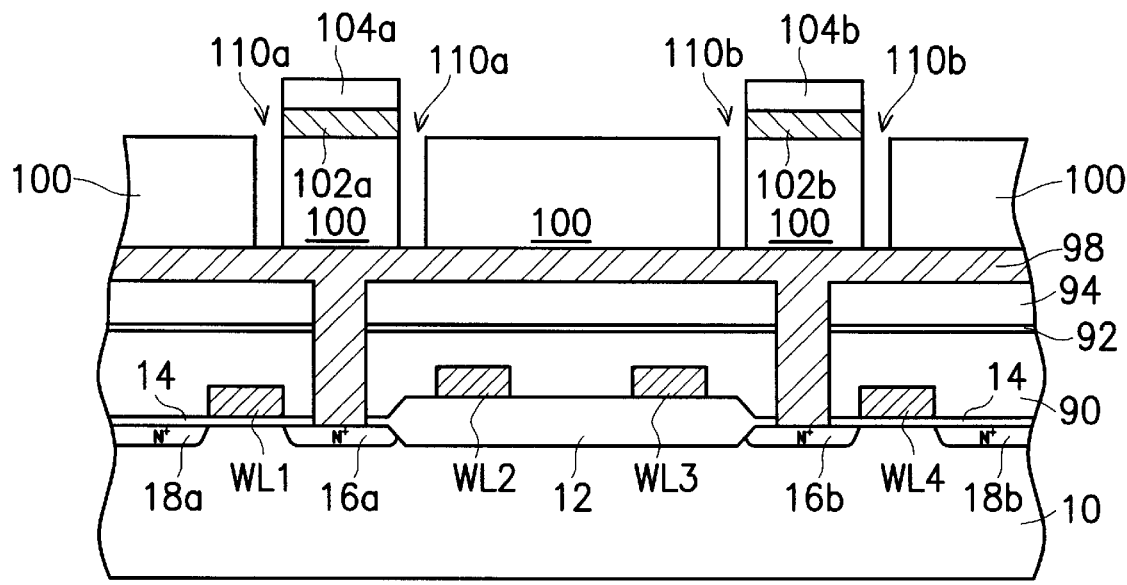

Referring next to FIG. 8C, in the subsequent step, using the stack layers 102a, 104a and 102b, 104b and the insulating layer 108 as etching masks, the silicon dioxide spacers 106a and 106b are removed by etching. Then, using the same stack layers 102a, 104a, and 102b, 104b and the insulating layer 108 as etching masks, the insulating layer 100 is etched until the surface of the polysilicon layer 98 is reached. Next, using the sacrificial polysilicon layers 104a, 104b as etching masks, the insulating layer 108 is removed by etching. Thus, openings 110a and 110b are formed.

Figure 8D:
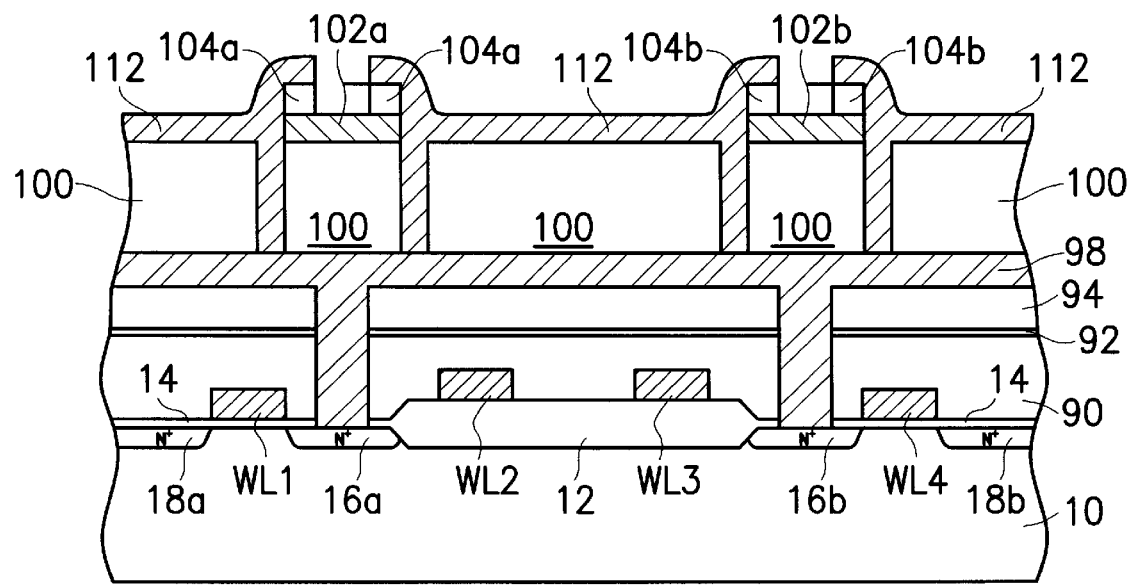

Referring next to FIG. 8D, in the subsequent step a polysilicon layer 112 is deposited on the surfaces of the stack layers 102a, 104a and 102b, 104b and the insulating layer 100, for example, to a thickness of approximately 1000 Å, and also to fill up the openings 100a and 110b. To increase the conductivity of the polysilicon layer 112, arsenic ions, for example, can be implanted into the polysilicon layer 112. After that, a conventional photolithography and etching process is performed to define the polysilicon layer 112 and the sacrificial polysilicon layers 104a, 104b. As a result, the portions above the insulating layers 102a, 102b are divided to form the structure shown in the drawing.

Figure 8E:
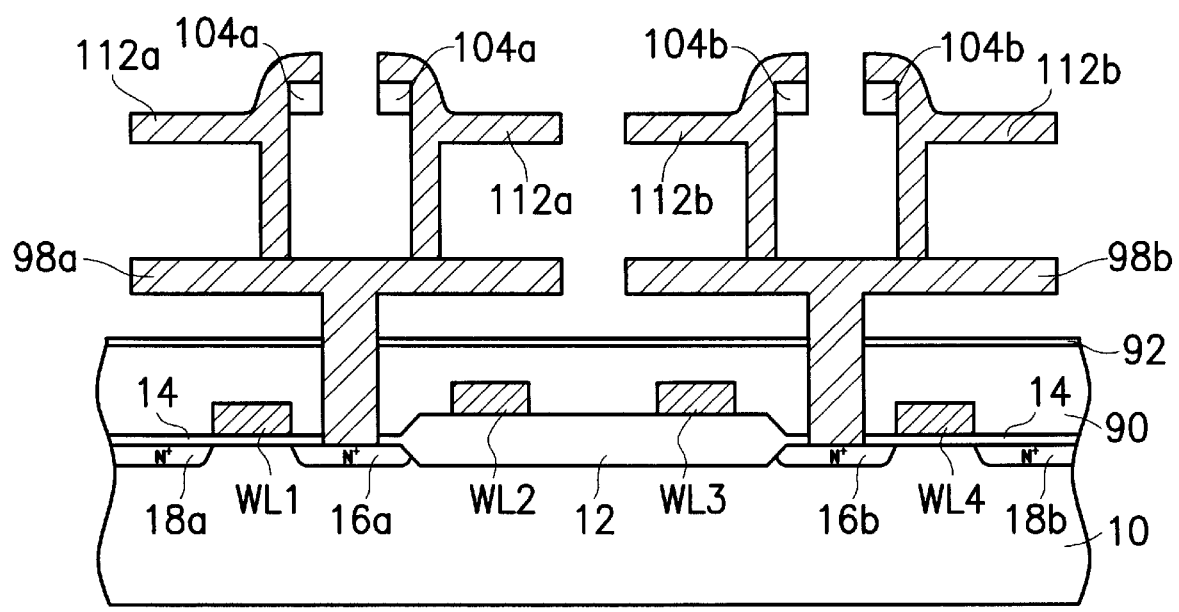

Referring next to FIG. 8E, in the subsequent step, using the polysilicon layer 112 and the sacrificial polysilicon layers 104a, 104b as masks, a wet etching process is performed to etch away the insulating layers 102a, 102b and the insulating layer 100 below, in sequence. Thereafter, a conventional photolithigraphy and etching process is performed to etch, in sequence, the polysilicon layer 112, the insulating layer 100, and the polysilicon layer 98, so as to define a storage electrode of the charge storage capacitor for each memory unit. Through the above steps, the polysilicon layers 112 and 98 are divided into sections 112a, 112b and 98a, 98b. Next, using the etching protection layer 92 as the etch end point, a wet etching process is again performed to remove the insulating layers 100 and 94. The fabrication of a storage electrode of the charge storage capacitor in the DRAM is thus complete. As shown in FIG. 8E, the storage electrode includes a trunk-like polysilicon layer 98a/98b and a branch-like polysilicon layer 112a/112b having a T-shaped cross section. The trunk-like polysilicon layers 98a, 98b are electrically coupled to the respective drain regions 16a, 16b of the transfer transistors in the DRAM. A distance is maintained between the bottom surfaces of the horizontal section of the trunk-like polysilicon layers and the top surfaces of the etching protection layer 92, so as to increase the surface area of the storage electrode. The branch-like polysilicon layers 112a, 112b generally have a hollow cylindrical shape, although the horizontal cross section can be circular, rectangular, or any other shape. The branch-like polysilicon layers 112a, 112b extend vertically upward a certain distance from the top surfaces of the trunk-like polysilicon layers 98a, 98b, and then extend horizontally in an outward direction.

It will be apparent to those skilled in the art of semiconductor fabrication that the foregoing disclosed embodiments can be applied either alone or in combination so as to provide storage electrodes of various sizes and shapes on a single DRAM chip. These variations are all contemplated to be within the scope of the invention.

Although in the accompanying drawings, the embodiments of the drains of the transfer transistors are based on diffusion areas in a silicon substrate, other variations, for example trench-type drain regions, are possible.

Elements in the accompanying drawings are schematic diagrams for demonstrative purpose only and therefore are not depicted to an actual scale. The shapes, dimensions, and extension angles of the elements of the invention as shown are not limitations on the scope of the invention.

While the invention has been described by way of example and in terms of preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for fabricating a semiconductor memory device having a substrate, a transfer transistor formed on the substrate, and a charge storage capacitor electrically coupled to a source/drain region of the transfer transistor, the method comprising the following steps:

(a) forming a first insulating layer over the substrate, covering the transfer transistor;

(b) forming a first conductive layer, which penetrates at least through the first insulating layer, and is electrically coupled to the source/drain region of the transfer transistor;

(c) forming a second insulating layer on the first conductive layer;

(d) forming a stack layer above the second insulating layer;

(e) forming a third insulating layer on sidewalls of the stack layer;

(f) forming a fourth insulating layer on exposed surfaces of the second and third insulating layers;

(g) removing the third and fourth insulating layers and a portion of the second insulating layer below the third insulating layer, until a portion of the surface of the first conductive layer is exposed, thus forming an opening;

(h) forming a second conductive layer on surfaces of the stack layer and the second insulating layer and filling the opening;

(i) removing a portion of the second conductive layer above the stack layer;

(j) removing the stack layer;

(k) removing a portion of the second insulating layer below a region in which the stack layer was located to expose the surface of the first conductive layer;

(l) defining the first and second conductive layers such that a first end of the second conductive layer is connected to a top surface of the first conductive layer, wherein the first conductive layer forms a trunk-like conductive layer and the second conductive layer forms a branch-like conductive layer, and the first and the second conductive layers in combination form a storage electrode of the charge storage capacitor;

(m) removing a remaining portion of the second insulating layer;

(n) forming a dielectric layer on exposed surfaces of the first and second conductive layers; and (o) forming a third conductive layer over a surface of the dielectric layer to form an opposing electrode of the charge storage capacitor.

2. A method according to claim 1, wherein the trunk-like conductive layer has a T-shaped cross section.

3. A method according to claim 1, wherein the trunk-like conductive layer has a U-shaped cross section.

4. A method according to claim 1, wherein the branch-like conductive layer has a hollow cylindrical shape with an L-shaped cross section.

5. A method according to claim 4, wherein the branch-like conductive layer includes a first segment and a second segment, the first segment extends vertically upward from the top surface of the trunk-like conductive layer, and the second segment extends from an end of the first segment.

6. A method according to claim 5, wherein the second segment of the branch-like conductive layer extends horizontally from the end of the first segment, in an outward direction.

7. A method according to claim 5, wherein the second segment of the branch-like conductive layer extends horizontally from the end of the first segment, in an inward direction.

8. A method according to claim 5, wherein the first segment is coupled to the trunk-like conductive layer at a peripheral edge of the trunk-like conductive layer, and the second segment of the branch-like conductive layer extends horizontally from the end of the first segment in a direction toward an opposite peripheral edge of the trunk-like conductive layer.

9. A method according to claim 3, wherein said step (b) includes forming a portion of the first conductive layer having a U-shaped cross section.

10. A method according to claim 1, further including a step of forming an etching protection layer on the first insulating layer, after said step (a) and before said step (b).

11. A method according to claim 1, wherein said step (i) further includes performing chemical-mechanical polishing to polish away a portion of the second conductive layer above the stack layer.

12. A method according to claim 1, wherein said step (i) further includes etching away a portion of the second conductive layer above the stack layer.

13. A method according to claim 1, wherein said step (d) includes the following steps: forming, in sequence, a first film layer and a second film layer on the second insulating layer, wherein the second film layer includes conductive material and the first film layer includes insulating material;
defining the first and second film layers to form the stack layer.

14. A method according to claim 1, further including forming an etching protection layer above the first insulating layer, and forming a fifth insulating layer over the etching protection layer, after said step (a) and before said step (b); wherein
said step (b) further includes a step of forming a first conductive layer that penetrates through the fifth insulating layer and the etching protection layer; and
said step (m) further includes a step of removing the fifth insulating layer.

15. A method according to claim 1,
wherein said steps (c) through (j) define a method for fabricating pre-defined branch-like conductive layer of the charge storage capacitor,
the method according to claim 1 further including fabricating at least one additional predefined branch-like conductive layer, after said step (j),
said step (l) further including defining each additional pre-defined branch-like conductive layer such that a respective first end of each pre-defined branch-like conductive layer is connected to the top surface of the first conductive layer to form an additional branch-like conductive layer,
said step (m) further including removing remaining portions of any insulating layer, and
said step (n) further includes forming a dielectric layer on exposed surfaces of each additional branch-like conductive layer.

16. A method according to claim 15, wherein the trunk-like conductive layer has a T-shaped cross section.

17. A method according to claim 15, wherein the trunk-like conductive layer has a U-shaped cross section.

18. A method according to claim 15, wherein the branch-like conductive layer has a hollow cylindrical shape with an L-shaped cross section.

19. A method according to claim 18, wherein the branch-like conductive layer includes a first segment and a second segment, the first segment extends vertically upward from the top surface of the trunk-like conductive layer, and the second segment extends from an end of the first segment.

20. A method according to claim 19, wherein the second segment of the branch-like conductive layer extends horizontally from the end of the first segment, in an outward direction.

21. A method according to claim 19, wherein the second segment of the branch-like conductive layer extends horizontally from the end of the first segment, in an inward direction.

22. A method according to claim 19, wherein the first segment is coupled to the trunk-like conductive layer at a peripheral edge of the trunk-like conductive layer, and the second segment of the branch-like conductive layer extends horizontally from the end of the first segment in a direction toward an opposite peripheral edge of the trunk-like conductive layer.

23. A method according to claim 17, wherein said step (b) includes forming a portion of the first conductive layer having a U-shaped cross section.

24. A method according to claim 15, further including a step of forming an etching protection layer on the first insulating layer, after said step (a) and before said step (b).

25. A method according to claim 15, wherein said step (i) further includes performing chemical-mechanical polishing to polish away a portion of the second conductive layer above the stack layer.

26. A method according to claim 15, wherein said step (i) further includes etching away a portion of the second conductive layer above the stack layer.

27. A method according to claim 15, further including:
forming an etching protection layer above the first insulating layer, and forming a fifth insulating layer over the etching protection layer, after said step (a) and before said step (b); wherein
said step (b) further includes the step of forming a first conductive layer that penetrates through the fifth insulating layer and the etching protection layer; and
said step (l) further includes the step of removing the fifth insulating layer.

28. A method for fabricating a semiconductor memory device having a substrate, a transfer transistor formed on the substrate, and a charge storage capacitor electrically coupled to a source/drain region of the transfer transistor, the method comprising the following steps:
(a) forming a first insulating layer over the substrate, covering the transfer transistor;
(b) forming a first conductive layer, which penetrates at least through the first insulating layer, and is electrically coupled to the source/drain region of the transfer transistor;
(c) forming a second insulating layer on the first conductive layer;
(d) forming a stack layer above the second insulating layer;
(e) forming a third insulating layer on sidewalls of the stack layer;
(f) forming a fourth insulating layer on exposed surfaces of the second and third insulating layers;
(g) removing the third and fourth insulating layers and a portion of the insulating layer below the third insulating layer, until a portion of the surface of the first conductive layer is exposed, thus forming an opening;
(h) forming a second conductive layer on surfaces of the stack layer and the second insulating layer and filling the opening;
(i) removing a portion of the second conductive layer above the stack layer;
(j) removing the stack layer;
(k) forming a fifth insulating layer on exposed surfaces of the second conductive layer and the second insulating layer;
(l) etching the fifth insulating layer until a portion of the surface of the first conductive layer is exposed, forming a second opening;
(m) forming a third conductive layer on the surface of the fifth insulating layer and in the second opening;
(n) defining the third, second, and first conductive layers such that respective first ends of the third and second conductive layers are connected to the top surface of the first conductive layer, wherein the first conductive layer forms a trunk-like conductive layer, the second conductive layer forms a first branch-like conductive layer, and the third conductive layer forms a second branch-like conductive layer, and the first, second, and third conductive layers together form a storage electrode of the charge storage capacitor;

(o) removing remaining portions of the fifth and second insulating layers;

(p) forming a dielectric layer over exposed surfaces of the first, second, and third conductive layers; and (q) forming a fourth conductive layer over the surface of the dielectric layer to form an opposing electrode of the charge storage capacitor.

29. A method according to claim 28, wherein the trunk-like conductive layer has a T-shaped cross section.

30. A method according to claim 28, wherein the trunk-like conductive layer has a U-shaped cross section.

31. A method according to claim 28, wherein the first branch-like conductive layer has a hollow cylindrical shape with an L-shaped cross section.

32. A method according to claim 31, wherein the first branch-like conductive layer includes a first segment and a second segment, the first segment extends vertically upward from the top surface of the trunk-like conductive layer, and the second segment extends from an end of the first segment.

33. A method according to claim 31, wherein the second segment of the first branch-like conductive layer extends horizontally from the end of the first segment, in an outward direction.

34. A method according to claim 31, wherein the second segment of the first branch-like conductive layer extends horizontally from the end of the first segment, in an inward direction.

35. A method according to claim 31, wherein the first segment is coupled to the trunk-like conductive layer at a peripheral edge of the trunk-like conductive layer, and the second segment of the first branch-like conductive layer extends horizontally from the end of the first segment in a direction toward an opposite peripheral edge of the trunk-like conductive layer.

36. A method according to claim 28, wherein the second branch-like conductive layer has a T-shaped cross section.

37. A method according to claim 28, wherein the second branch-like conductive layer is pillar-shaped, and extends vertically upward from the top surface of the trunk-like conductive layer.

38. A method according to claim 30, wherein said step (b) includes forming a portion of the first conductive layer having a U-shaped cross section.

39. A method according to claim 28, further including a step of forming an etching protection layer on the first insulating layer, after said step (a) and before said step (b).

40. A method according to claim 28, wherein said step (i) further includes performing chemical-mechanical polishing to polish away a portion of the second conductive layer above the stack layer.

41. A method according to claim 28, wherein said step (i) further includes etching away a portion of the second conductive layer above the stack layer.

42. A method according to claim 28, wherein said step (d) includes the following steps:

forming in sequence, a first film layer and a second film layer on the second insulating layer, wherein the second film layer includes conductive material and the first film layer includes insulating material;

defining the first and second film layers to form the stack layer.

43. A method according to claim 28, further including forming an etching protection layer above the first insulating layer, and forming a sixth insulating layer over the etching protection layer, after said step (a) and before said step (b); wherein said step (b) further includes the step of forming a first conductive layer that penetrates through the sixth insulating layer and the etching protection layer; and said step (o) further includes the step of removing the sixth insulating layer.

44. A method according to claim 1, wherein said steps (c) through (j) define a method for fabricating pre-defined branch-like conductive layer of the charge storage capacitor, the method according to claim 1 further including fabricating at least one additional predefined branch-like conductive layer, after said step (j), said step (n) further including defining each additional pre-defined branch-like conductive layer such that a respective first end of each pre-defined branch-like conductive layer is connected to the top surface of the first conductive layer to form an additional branch-like conductive layer, said step (o) further including removing remaining portions of any insulating layer, and said step (p) further includes forming a dielectric layer on exposed surfaces of each additional branch-like conductive layer.

45. A method according to claim 44, wherein the first branch-like conductive layer has a hollow cylindrical shape with an L-shaped cross section.

46. A method according to claim 45, wherein the first branch-like conductive layer includes a first segment and a second segment, the first segment extends vertically upward from the top surface of the trunk-like conductive layer, and the second segment extends from an end of the first segment.

47. A method according to claim 46, wherein the second segment of the first branch-like conductive layer extends horizontally from the end of the first segment, in an outward direction.

48. A method according to claim 46, wherein the second segment of the first branch-like conductive layer extends horizontally from the end of the first segment, in an inward direction.

49. A method according to claim 46, wherein the first segment is coupled to the trunk-like conductive layer at a peripheral edge of the trunk-like conductive layer, and the second segment of the first branch-like conductive layer extends horizontally from the end of the first segment in a direction toward an opposite peripheral edge of the trunk-like conductive layer.

50. A method according to claim 44, wherein the second branch-like conductive layer has a T-shaped cross section.

51. A method according to claim 44, wherein the second branch-like conductive layer is pillar-shaped, and extends vertically upward from the top surface of the trunk-like conductive layer.

* * * * *